(12) United States Patent
Neureuther et al.

(10) Patent No.: US 7,030,997 B2
(45) Date of Patent: Apr. 18, 2006

(54) CHARACTERIZING ABERRATIONS IN AN IMAGING LENS AND APPLICATIONS TO VISUAL TESTING AND INTEGRATED CIRCUIT MASK ANALYSIS

(75) Inventors: Andrew R. Neureuther, Berkeley, CA (US); Kostas Adam, Berkeley, CA (US); Garth C. Robins, Berkeley, CA (US); Frank E. Gennari, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 456 days.

(21) Appl. No.: 10/241,242

(22) Filed: Sep. 10, 2002

(65) Prior Publication Data

US 2003/0103189 A1 Jun. 5, 2003

Related U.S. Application Data

(60) Provisional application No. 60/322,381, filed on Sep. 11, 2001.

(51) Int. Cl.
*G01B 11/02* (2006.01)
*G01B 9/02* (2006.01)

(52) U.S. Cl. .................. 356/515; 356/516; 356/521

(58) Field of Classification Search ............... 356/124, 356/515–516, 521
See application file for complete search history.

(56) References Cited

U.S. PATENT DOCUMENTS 5,828,455 A 10/1998 Smith et al.
5,978,085 A 11/1999 Smith et al.
6,368,763 B1 * 4/2002 Dirksen et al. ............... 430/30

OTHER PUBLICATIONS

Imai, Akira et al., "Lens aberration measurement technique using attenuated phase-shifting mask" *Proceedings of the SPIE—The International Society of Optical Engineering*, C.J. Progler, Editor, vol. 4000, pt. 102, (Optical Microlithography XIII, Santa Clara, CA, USA, Mar. 1-3, 2000) pp. 1260-1268.

* cited by examiner

*Primary Examiner*—Gregory J. Toatley, Jr.
*Assistant Examiner*—Amanda Merlino
(74) *Attorney, Agent, or Firm*—Beyer Weaver & Thomas LLP

(57) ABSTRACT

Aberrations in a lens and lens system are identified by projecting an optical beam through a mask having an opening (probe) and a surrounding open geometry (pattern) and through the lens to an image plane. Lens aberrations are identified from the combined intensity of the beam in the image plane. In one embodiment the pattern is a plurality of rings concentric with the probe. Spillover between the probe and the geometry becomes intermixed in passing through the lens and alters the light intensity in the image plane. Vision of a patient can be tested by providing a plurality of probe openings and surrounding geometries that are illuminated. The patient then compares the images for brighter and darker probes as a measure of pupil aberrations. Areas in an integrated circuit mask layout impacted by aberrations in projection printing can be identified by sequentially comparing an aberration function to a mask layout, which can then be used to modify the mask layout.

25 Claims, 21 Drawing Sheets

No Aberration

Spherical

Coma

Astigmatism

Trifoil

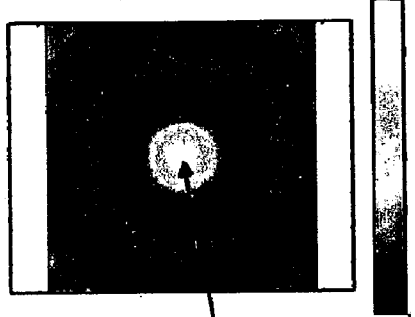
Peak on-axis
Radius of null = 0.61λ/NA
FIG. 17A No Aberrtion
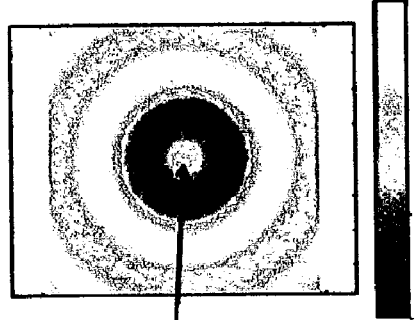
Null on-axis
Radius of peak is 0.54 λ/NA
FIG. 17B Defocus
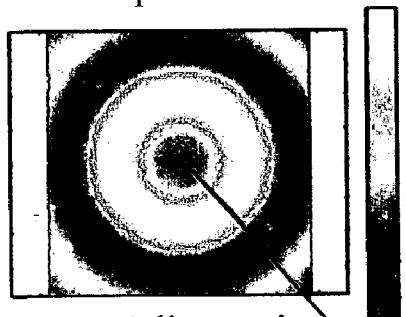
Null on-axis
Radius of peak is 0.84 λ/NA
FIG. 17C Spherical
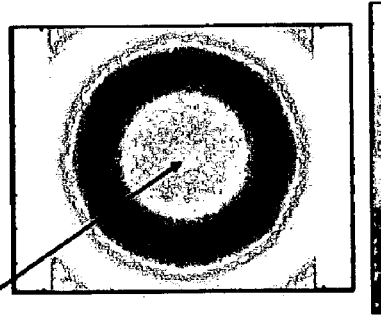
Null on-axis
Radius of peak is 1.21 λ/NA
FIG. 17D Higher-Order Spherical

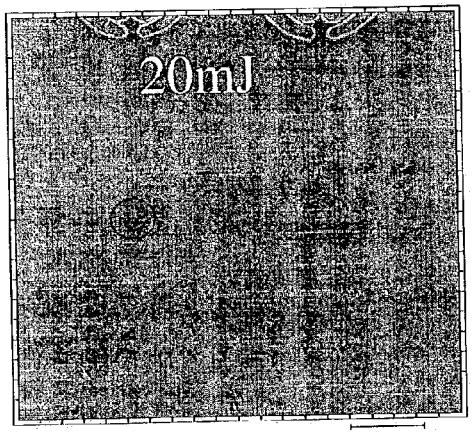
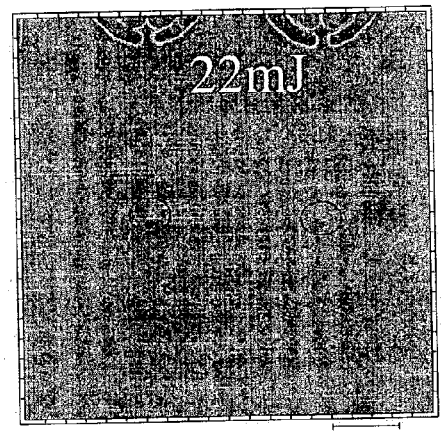
FIG. 25
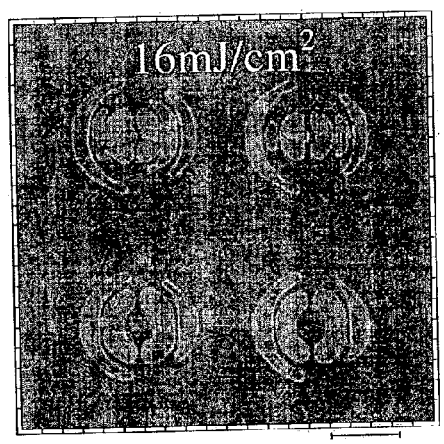
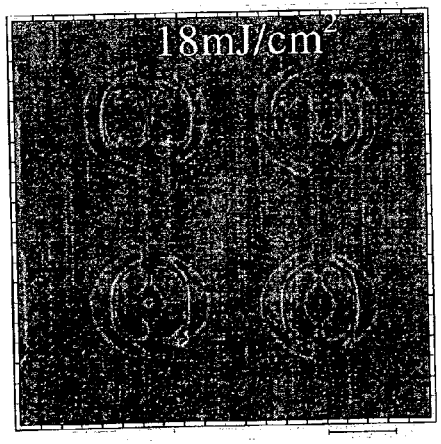
FIG. 26          FIG. 27

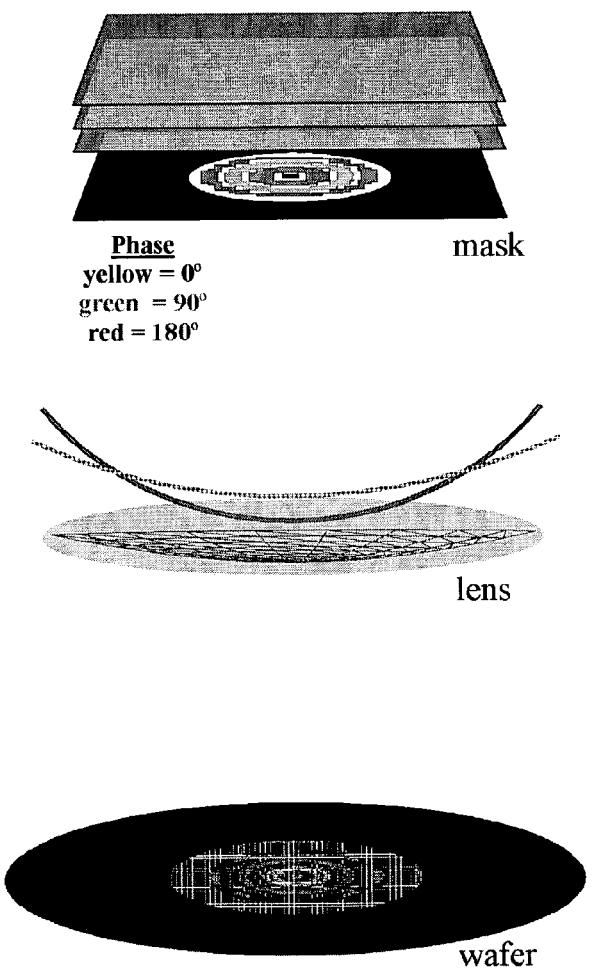
FIG. 28
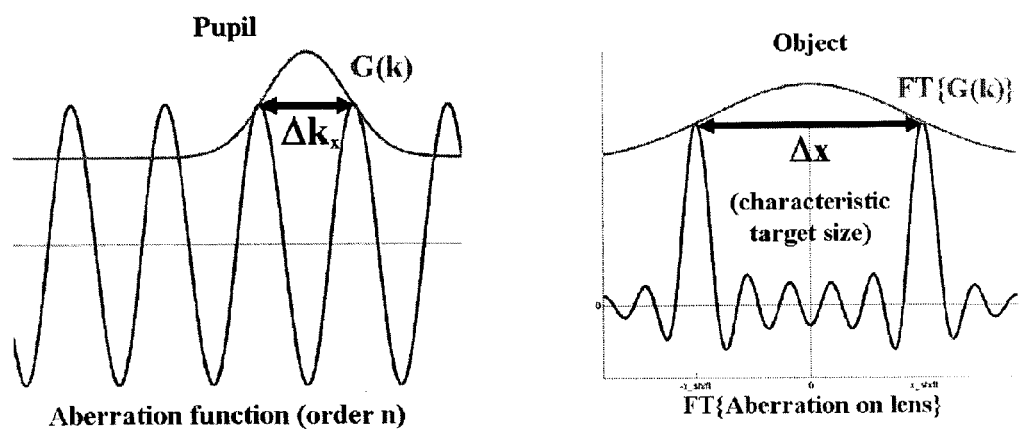
FIG. 30A       FIG. 30B

System Block Diagram

PATTERN GENERATOR

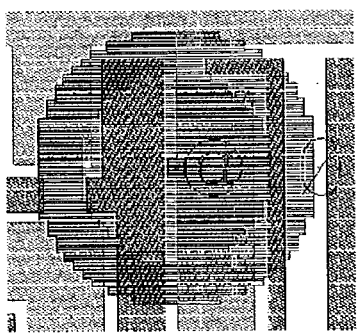
*FIG. 40*
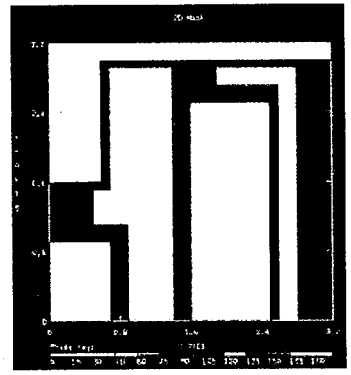
*FIG. 41*
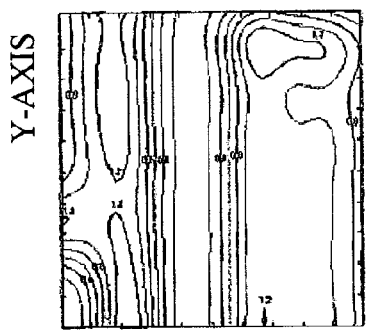
*FIG. 42*
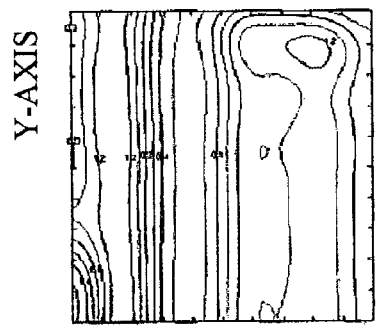
*FIG. 43*
*FIG. 44*

CHARACTERIZING ABERRATIONS IN AN IMAGING LENS AND APPLICATIONS TO VISUAL TESTING AND INTEGRATED CIRCUIT MASK ANALYSIS

CROSS-REFERENCES TO RELATED APPLICATIONS

This application claims priority from provisional application Ser. No. 60/322,381, filed Sep. 11, 2001, which is incorporated herein for all purposes.

STATEMENT AS TO RIGHTS TO INVENTIONS MADE UNDER FEDERALLY SPONSORED RESEARCH OR DEVELOPMENT

The U.S. Government has rights in the disclosed invention pursuant to DARPA Contract MDA 972-97-1-0010 and DARPA Grant MDA 972-01-1-0021 with the University of California at Berkeley.

BACKGROUND OF THE INVENTION

This invention relates generally to imaging lens systems, and more particularly the invention relates to the characterization of aberrations in an optical lens and lens system and to visual testing and integrated circuit mask analysis.

In the fabrication of electronic integrated circuits, line patterns of less than a tenth of a micron are now being developed. This is less than 1/500 the width of a human hair. At these dimensions, the projection printing of mask patterns in integrated circuit layout can be adversely impacted by small residual aberrations in the lens system. While the quality metric (Strehl ratio) of today's projection printers is within a few percent of unity, residual aberrations still contribute significant spillover of signals from one mask opening in another. These spillover effects degrade the image quality with position within the field of the die. Good correlation of measured aberrations with the difference in horizontal and vertical linewidth along the slit in a scanning system has been observed. Such aberration-based linewidth variations are themselves partially mitigated by higher image slopes created through optical proximity correction (OPC). Yet residual cross-chip linewidth variations suggest that residual aberrations continue to contribute a level of degradation that is about half as large as the level of improvement gained through applying OPC. The impact of these aberration-based spillover effects will clearly become more important with phase shifting masks due to the inherent use of more coherent illumination as well as the presence of both phases to more efficiently direct energy to a broader set of locations in the lens pupil. Since lithography at low k1 and high NA is adversely affected by small residual aberrations in lenses even though Strehl ratios exceed 0.98, test targets are needed to act as 'canaries' that are more sensitive than product features as well as to quantify individual aberrations to 0.01 $\lambda$rms.

BRIEF SUMMARY OF THE INVENTION

A primary object of the invention is characterizing a lens and lens system as to aberrations through the use of a probe and surrounding pattern by illuminating a mask having a small opening (probe) and a surrounding adjacent open geometry (pattern). The combined intensity pattern at the probe position near an image plane of the lens is then observed for spillover from the surrounding pattern that occurs in passing through the lens. For this application, patterns corresponding to the inverse Fourier transform (IFT) of aberration representations used in characterizing lenses can be utilized. This gives an indication of the presence and level of lens aberrations, such as coma, astigmatism, spherical, and trifoil or even individual terms in the Zernike representation. Measurements of the combined image compared to the individual image of the probe and pattern thus contain quantitative information on the level of aberrations. This intensity change can be observed directly by signal detection or indirectly by, for example in lithography, wafer exposures at various doses and comparing the dose at which the various parts of the image print in photoresist with the dose required to clear large areas or isolated probes.

In an application for testing the human eye, a mask containing probes surrounded by various patterns is illuminated and viewed by one eye at a time. The patient then compares patterns among the set and ascertains which of the targets appear to have brighter or darker centers. This perception by a patient will be dependent on the aberrations present in each eye. The type of target can be used to identify the type of pattern, and the degree of imbalance quantifies the level of that aberration. For this application, patterns corresponding to the inverse Fourier transform of aberration representations used in medical practice can be utilized. Also, complementary patterns with opposite phase openings can be utilized to make the surroundings identical and thereby minimize effects in human perception. In addition an intermediate relay optic can add compensation and be iteratively adjusted by the doctor so that the patent need not quantify the degree of difference but simply decide when the intensities are the same. The compensated settings then reveal the patient's prescription.

Another aspect of the invention lies in a pattern-matching method for predicting worst case locations of residual aberration induced feature changes in projection printing large layouts including chip layouts used in integrated circuit manufacturing. A CAD system can rapidly determine locations in large layouts that are most impacted by aberrations in projection printing. For this application, aberrations are accurately modeled as producing spillover between mask openings with a localized pattern that is the inverse Fourier transform (IFT) of the optical path difference (OPD) function in the pupil. The novel function in the CAD system then quickly rank orders all pattern edges and corners according to the degree of similarity of their surrounding layout to the IFT function.

The invention is well suited for providing quantitative information about imaging systems for facilitating their dynamic correction such as actuator specific correction factors.

The invention is extensible to general imaging electromagnetic imaging systems (infrared, optical communications and radar), and general wave systems including acoustic (inspection, sonar, surface wave devices), surface waves (liquids and solids), and particle imaging systems due to the dual nature of particles and waves.

The pattern-matching invention is extensible to non-lithography processing including, for example, chemical mechanical polishing (CMP).

The invention and objects and features thereof will be more readily apparent from the following description and appended claims when taken with the drawings.

BRIEF DESCRIPTION OF THE DRAWINGS

FIGS. 17A–17D illustrate two-dimensional inverse Fourier transforms of pupil distributions for a) a uniformly filled pupil (no aberration), b) defocus ($Z_{2,0}$), c) spherical ($Z_{4,0}$) and d) higher order spherical ($Z_{6,0}$).

FIG. 25 SEM's of printed resist image from an isolated probe target exposure at two different exposure doses showing positive resist development at the probe position with increased exposure dose.

FIG. 26 SEM's of printed resist image from a coma aberration target exposure at two different exposure doses showing positive resist development at the probe position with increased exposure dose.

FIG. 27 SEM's of printed resist image from a higher order coma aberration target exposure at two different exposure doses showing positive resist development at the probe location with increased exposure dose.

FIG. 28 illustrates operation of the pattern and probe based aberration monitor. The probe and surrounding pattern create spherical and aberrated wavefronts, respectively. The interaction of the pre-aberrated wavefront with the lens aberration controls the intensity at the probe position in the image plane.

FIG. 30 illustrates a one-dimensional aberration function in a pupil with peak-to-peak spacing, $\Delta k_x$, and FIG. 30 illustrates spacing, $\Delta r$, of the central peaks of two laterally shifted sine-functions representing the idea fields at the object plane to detect a given sinusoidal aberration in the lens.

FIG. 40 is a close-up of the match location showing the high correlation of about 0.7 between the coma pattern and the underlying mask geometry.

FIG. 41 illustrates that mask layout geometry near the match location is automatically extracted and made available for simulation. Shown here is a Drawmask plot of a SPLAT input file.

FIG. 42 is a SPLAT aerial image simulation contour plot of the previous coma pattern match without aberrations.

FIG. 43 is a SPLAT plot of coma match with 0.1 waves of simple coma added.

FIG. 44 illustrates a handcrafted layout of test structures designed to be sensitive to trifoil, coma, and spherical aberrations.

DETAILED DESCRIPTION OF THE INVENTION

Figure 1:
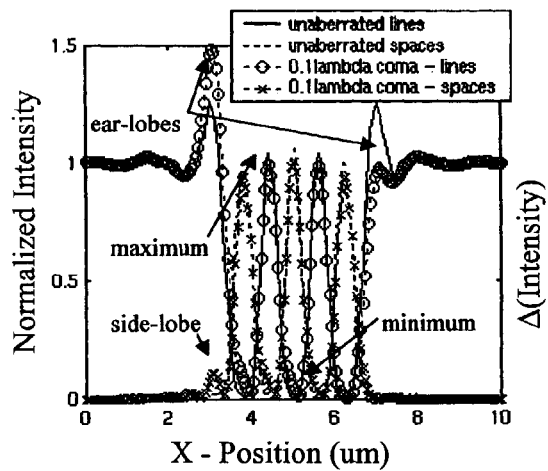
FIG. 1 illustrates image intensity for 3 line (clear field) and 3 space (dark field) 0.6 λ/NA patterns with and without 0.1λ of balanced coma.

The impact of aberrations on lithography is an increasing concern in extending the limits of optical lithography. Brunner has given an excellent overview of the subject (T. A. Brunner, "Impact of lens aberrations on optical lithography," IBM J. Res. Develop, Vol. 41, No. 1/2, pp. 57–67, March 1997) and the large number of photoresist-based techniques were recently classified by Kirk (J. Kirk, "Review of photoresist based lens evaluation methods," SPE 4000, 2000). Other relevant work includes focus monitors based on shifts of phase-edge line positions with focus (T. A. Brunner, A. L. Martin, R. M. Marino, C. P. Ausschnitt, T. H. Newman and M. S. Hibbs, "Quantitative stepper metrology using the focus monitor test mask," SPIE Vol. 2197, pp. 541–549, 1994), measurements of localized pupil tilt based translation of large features projected from a special aperture restricting mask by Litel, SEM's of shapes of images of λ/2 phase-dots by Dirksen et al., and measurements of exposure sensitivity of side-lobe artifacts on halftone mask edges by Hayano, Fukuda and Imai. The strategy here is similar to that of the latter in which the exposure sensitivity of an artifact in the vicinity of an exposed area is utilized. Here, super-sized defects are used to interact with the side-lobe spillover from the exposed area instead of the transmission by the halftone area. Since this spillover is often opposite in phase to the feature, this technique works well for strong phase shifting masks where opposite phasing is available. The approach also has some similarities to the work of Dirksen et al. in that the target simultaneously stimulates response from nearly the entire pupil. The work here also draws on the observation of Dirksen et al. and Fukuda et al. that there is a nearly linear relationship of contributions of various Zernike aberration terms to the perturbation of the image in response to the presence of aberrations.

The understanding as to how super-sized defects interact with aberrations is based on the perturbation model for defect-feature interactions, in which the electric fields (rather than intensities) are added for the defect and feature. This assumes these signals are highly coherent, which is the case when the partial coherence factor σ is small (0.3). The images that will be shown here were simulated with SPLAT (K. H. Toh and A. R. Neureuther, "Identifying and Monitoring Effects of Lens Aberrations in Projection Printing," SPIE Proceedings, Vol. 772, pp. 202–209, 1987). The inputs to SPLAT were normalized such that a 0.1λ of a Zernike aberration corresponded to a peak-to-peak optical path difference across the pupil of 0.2λ. Since in the Zernike representation all terms are orthogonal, aberrations such as coma are naturally balanced (i.e. have tilt removed, etc.). The simulations are normalized using λ=0.5 μm and NA=0.5 so that 1 μm in the figures equals 1 λ/NA.

An understanding of the invention begins with an examination of how defects affect the various properties of an image such as the edges, peaks, minima and side-lobes. The related aberration measurement techniques of Dirksen et al. and Imai et al. are briefly considered, and the use of super-sized defects to probe side-lobes as affected by aberrations is then proposed. A strategy is presented for designing first the sensitivity of the target to a given aberration and then, through the use of rotational symmetry, its orthogonality to other aberrations. The workability of this approach for coma is considered specifically. The sensitivity and orthogonality of four targets designed for coma, astigmatism, trifoil and spherical aberrations to the corresponding 8 Zernike aberrations is assessed, and the accuracy and speed of the approach with automatic wafer inspection are estimated.

FIG. 1 shows images of three lines (clear field mask) and three spaces (dark field mask) with and without 0.1 waves of balanced coma oriented perpendicular to the lines. The feature size and spacing are 0.6 λ/NA and the horizontal dimension has been normalized such that 1 μm equals 1 λ/NA. Four attributes are highlighted in FIG. 1. The first is the large imbalance in the right and left ear-lobes at the edges of the clear field. The second is the decrease in the peak intensity (as expected from the Strehl ratio). The third is the increase of the minimum intensity. The fourth highlighted attribute is the increase in the height of the side-lobe as a separate peak located a distance of about 0.6 λ/NA from the feature edge.

Figure 2:
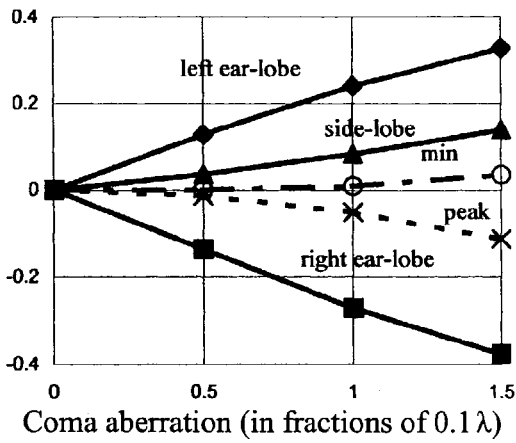
FIG. 2 is a graph of change in the image attribute relative to the full clear field value as a function of the level of balanced coma for five attributes a) left ear-lobe, b) right ear-lobe, c) side-lobe, d) peak, and e) minimum.

The magnitude of the changes of these five image attributes to the level of balanced coma is shown in FIG. 2. The car-lobes are by far the most sensitive. They each change in opposite directions and are 25% of the clear field value in height for 0.1λ of balanced coma. The magnitude of the decrease in the peak intensity (which is related to the Strehl ratio) grows quadratically but has only reached about 5% of the clear field value at 0.1λ. The minimum intensity starts at 0.6% of the clear field and rises quadratically even more slowly. The side-lobe, however, starts from 2.5% of the clear field and rises nearly proportional to the level of the aberration and changes by 8% for $0.1\lambda$. The separated location, sensitivity and linearity of the side-lobe make it advantageous for use in aberration monitoring.

The aberration ring test (ART) introduced by Dirksen et al. uses a circular phase object in a clear field with $\lambda/2$ phase shift. The object is about $\lambda/NA$ in diameter and consequently prints as a circular ring in positive resist of roughly the same diameter. Without aberrations the inner and outer edges of the ring are concentric circles. Aberrations noticeably alter the outer contour from the ideal circular shape. The rings are measured in an SEM and analyzed for rotational harmonic content contributed by various Zernike terms. This analysis is based on the nearly linear manner in which various Zernike aberrations contribute to the measured image of the artifact. Through focus behavior is used to help identify aberrations with even symmetry. The fact that many of the pixels from the SEM image are used also appears to help by increasing the statistical averaging. Correlations with programmed aberrations indicate that the technique is accurate to below $0.01\lambda$.

Hayano, Fukuda and Imai et al. demonstrated an aberration measurement technique based on observing the printability of side-lobes using a knife-edge transition from a clear area to a 6% attenuated and $\lambda/2$ phase-shifted (halftone) area. Light is scattered along a diagonal in the lens pupil that is perpendicular to the line edge. A sizeable side-lobe is produced when aberrations such as coma are present. By over exposing, the side-lobe begins to print as a separate and easy to observe wafer artifact near the mask edge. The ratio of over-exposures required to print the side-lobes when coma is oriented toward and away from the knife-edge is nearly proportional to the waves of aberration. Measurements are made in all 8 directions of an octagon pattern and angular transformations deduce the levels of coma and trifoil. In practice, chrome coverings of all but one side were added to facilitate automatic optical wafer inspection. Noise free maps at resolution of $0.015\lambda$ were made of coma and trifoil across the field with only 20 minutes of automatic wafer inspection time. Fourier transform theory with a small phase expansion and symmetry relationships provides the conceptual basis and indicates that odd (even) aberrations produce real (imaginary) phased additions to the intensity amplitude.

Figure 3:
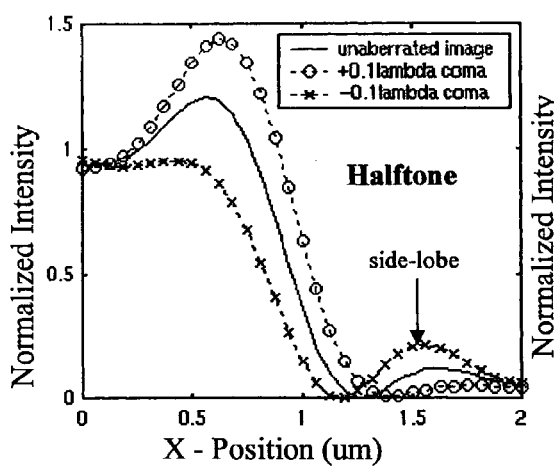
FIG. 3 illustrates an image of a 6% transmission λ/2 phase-shifting halftone knife-edge with zero and 0.1λ of balanced coma normal to the mask edge.

The image of the halftone knife-edge structure is shown in detail in FIG. 3 with no aberration and for $0.1\lambda$ of balanced coma oriented toward and away from the mask edge. On the left side, the intensity is near the clear field value (unity) and on the right side the intensity is much lower due to the transmission of only 6%. Notice however, that at a position of about $0.6\lambda/NA$ from the nominal line edge, there is about a factor of 4 change in the intensity level of the side-lobe as the $0.1\lambda$ of coma is rotated. The intensity goes from an unaberrated value of 0.121 to a low of 0.049 and a high of 0.214. Physically this large swing occurs because the light transmitted through the clear area spills over and coherently adds and subtracts with the light directly transmitted through the attenuated region. The halftone area provides an interferometric-like reference electric field with magnitude $\sqrt{0.06}=0.24$ and phase of $180°$ that makes this coherent addition and subtraction possible.

The programmed defect-probe method for measuring aberrations consists of introducing super-sized defects into the side-lobe intensity positions of features. These defects are sized at about $\frac{2}{3}$ of the nominal minimum feature size such that when they are isolated they produce a peak intensity of about 20% of the clear field. This size permits a suitable swing between the background due to flare and the level at which isolated defects print without over exposure. By being smaller that the feature size, these defects will have some, but a limited effect, back on the feature itself. The purpose of the programmed defects is to provide an interferometric-like reference electric field with which the electric fields in the side-lobe of the feature coherently interact. This reference field has its maximum at the geometrical center of the defect and has a physical size of about $\frac{2}{3}$ the point spread function for the optical system.

Figure 4:
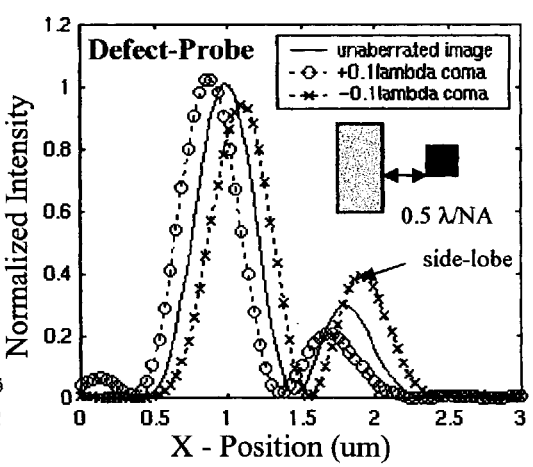
FIG. 4 illustrates an image of a 0.6 λ/NA line with a 0.4 λ/NA by 0.4 λ/NA phase defect with zero and 0.1λ of balanced coma normal to the feature.
Figure 5A:
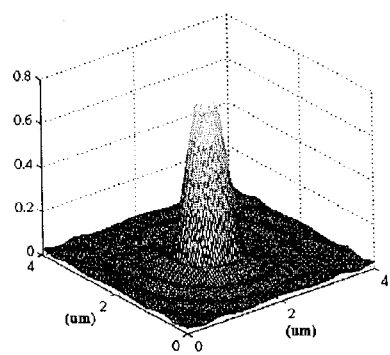
FIGS. 5A–5E illustrate point spread electric field (PSEF) for a) no aberration, b) spherical, c) coma, d) astigmatism, and e) trifoil. The aberrations are Zernike terms at a level of 0.1λ. Dimensions are normalized such that 1 µm is 1 λ/NA.
Figure 5B:
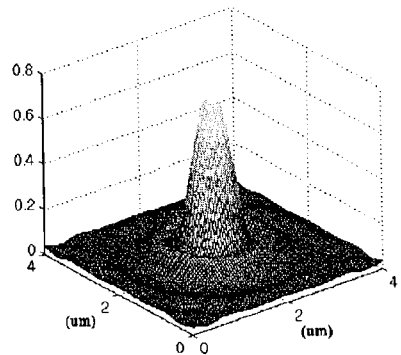
Figure 5C:
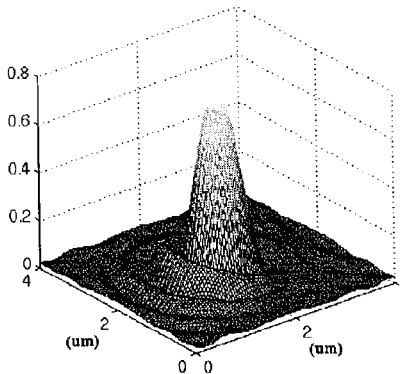
Figure 5D:
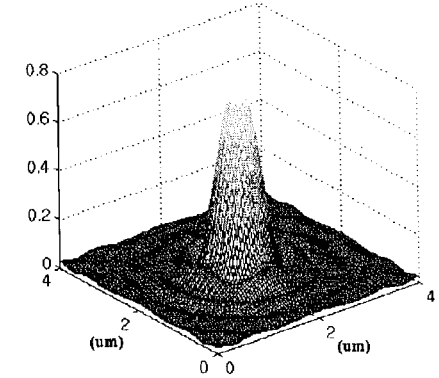
Figure 5E:
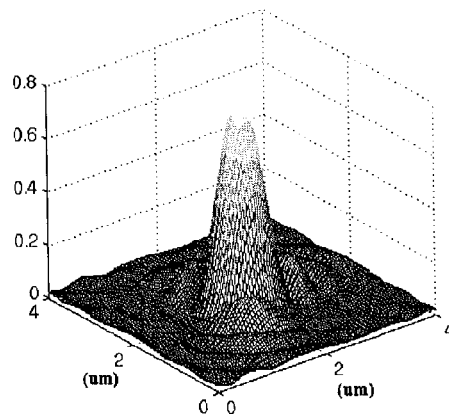

An example of a $0.4\lambda/NA$ by $0.4\lambda/NA$ $\lambda/2$ phase defect separated by $0.5\lambda/NA$ edge-to-edge from a feature is shown in FIG. 4. Here the feature is a vertical line $0.6\lambda/NA$. The intensity is shown for positive, zero and negative $0.1\lambda$ of balanced coma. The side-lobe without coma is about 30% of the clear field intensity. It rises to 40% and decreases to almost 20% with $0.1\lambda$ of coma as the direction of coma is rotated. By printing this artifact in a number of orientations both the direction and the amount of coma can be determined.

The general strategy for designing defect-probe based targets for different Zernike aberrations consists of three steps.

1) Characterizing the point spread electric field (PSEF) for a particular Zernike aberration.

2) Building-up target sensitivity for the Zernike aberration under consideration by inversely mapping the point spread electric field (PSEF) to locate positions and phases of target components that coherently add electric fields at the central defect-probe position.

3) Reducing target sensitivity to other Zernike aberrations by adding components to create the rotational angular dependence associated with the aberration under test.

The plots in FIG. 5 show the point spread electric field (PSEF) for $0.6\lambda/NA$ by $0.6\lambda/NA$ clear openings without and with $0.1\lambda$ ($0.2\lambda$ peak to peak) of Zernike terms for coma, astigmatism, trifoil and spherical aberrations. Here the vertical axis is the absolute value of the square root of the intensity in order to make the side-lobes much apparent. These plots do not reveal the phase but for small aberration levels the analysis by Fukuda et al. [8] indicates that odd (even) aberrations produce electric field perturbations that are real (imaginary) with respect to the unaberrated electric field. As real electric field perturbations, coma and trifoil show very pronounced side-lobes with $1^{st}$ and $3^{rd}$ order rotational symmetry associated with their $\cos(1\phi)$ and $\cos(3\phi)$ variation. Astigmatism has two pairs of symmetrical side-lobes due to its $\cos(2\phi)$ variation and these side-lobes are of only moderate size. Spherical has a broad rotationally invariant side-lobe associated with its constant angular behavior. Quantitative values of the peaks and side-lobes are given in Table I. The peak values follow the Strehl behavior of each particular aberration. The side-lobe electric field is about 0.08 without aberrations and approaches nearly twice that level for coma (0.15) and trifoil (0.14).

TABLE I

Side-lobe and central peak levels of the point spread electric fields for $0.1\lambda$ of various Zernike aberrations.

| Aberr. | Left | Center | Right |
|---|---|---|---|
| None | 0.079 | 0.817 | 0.079 |
| Defocu | 0.111 | 0.766 | 0.111 |

TABLE I-continued

Side-lobe and central peak levels of the point spread electric fields for 0.1 λ of various Zernike aberrations.

| Aberr. | Left | Center | Right |
|---|---|---|---|
| Coma | 0.1500 | 0.799 | 0.032 |
| Astig. | 0.099 | 0.795 | 0.099 |
| Trifoil | 0.136 | 0.801 | 0.030 |
| Spher | 0.123 | 0.770 | 0.123 |

Figure 7:
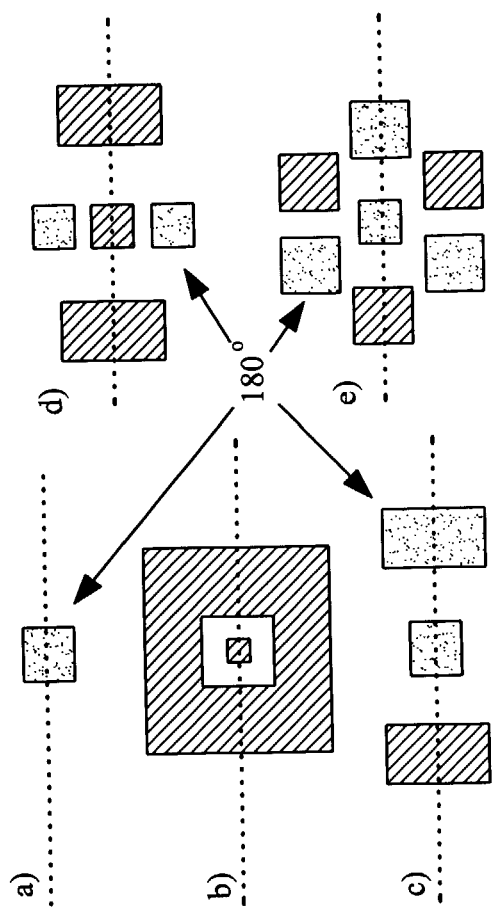
FIG. 7 illustrates examples of defect-probe based targets: a) defect-probe alone, b) spherical, c) coma, d) astigmatism, and e) trifoil.
Figure 6:
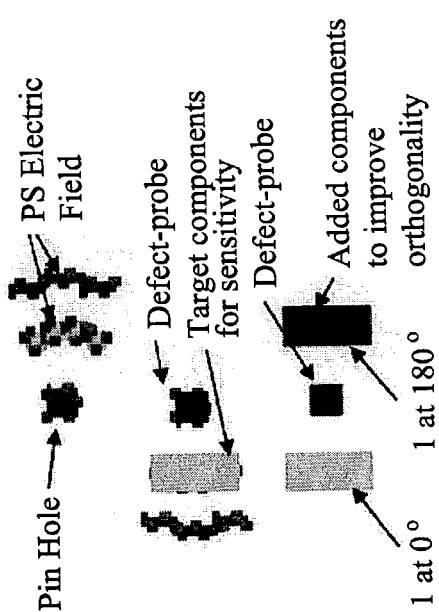
FIG. 6 illustrates design strategy of 1) deterring point spread electric field for an aberration, 2) using its inverse to 'color-in' phased openings in a dark field mask, and 3) adding components to reduce sensitivity to other aberrations.

The strategy for building the target geometry is outlined in FIG. 6. First the PSEF data from FIG. 5 is used to describe the tendency of a given aberration such as coma to spread energy about a point source location. Next an inverse copy of this PSEF is placed at the defect-probe location. Openings in a dark field mask with the appropriate phase are then used to 'color in' the PSEF to build up the sensitivity of the programmed defect. Here only the first side-lobe is utilized but the second side-lobe with appropriate phasing could also be used to increase the sensitivity further. Additional openings are then added with a rotational ordering and phasing consistent with that of the aberration under test. These added features help reduce mixing (confounding) by other aberrations and thus improve orthogonality. Finally, as was the case here, a few (2–5) simulations of small adjustments in sizing and spacing can be utilized to make minor improvements in 1) the zero aberration reference level, 2) the sensitivity to the aberration under test and 3) the orthogonality to other aberrations. Example aberration selective targets are shown in FIG. 7. Here a central programmed defect 0.4 λ/NA by λ/NA has been used with phase 180°. This particular size was chosen to give a reference intensity of about 0.20 of the clear field. (In practice, it would be best to make the central defect a chrome opening and reversing the phase of the feature elements, to avoid the difficulty of producing a full strength and phased signal from a small hole.) The dimension of the auxiliary feature in the direction of the aberration to be measured is 0.6 λ/NA as dictated by the respective PSEF. Note that during the design process these targets take on the rotational ($\cos(m\phi)$) behavior of the aberration. A placement and sizing grid of 0.1 λ/NA has also been assumed in the simulation tuning. This grid is ⅙ of the feature size and illustrates that good sensitivity naturally emerges without special tolerances.

Figure 8:
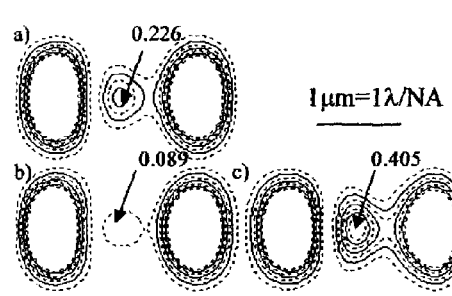
FIG. 8 illustrates intensity contours at 0.05 increments for the coma target with a) 0.0, b) −0.1 and c) 0.1λ of balanced coma.

The sensitivity of the coma target from FIG. 7 is shown in FIG. 8. The intensity at the programmed defect location is at a level of 0.226. With plus and minus 0.1λ of coma the peak of the local maximum changes to 0.405 and 0.089. This is more than 30% of the clear field intensity. The ratio of the swing has also increased to a factor of 4 as compared to the factor of 2 shown previously for the defect adjacent to a line in FIG. 4.

Figure 9:
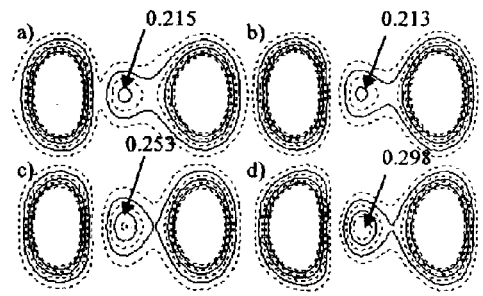
FIG. 9 illustrates intensity contours at 0.05 increments for the coma target with 0.1λ of a) defocus, b) astigmatism (cos), c) spherical and d) –trifoil (0°).

The confounding effects of defocus, astigmatism, trifoil and spherical aberrations (in their worst orientations) are shown in FIG. 9. The peak intensity at the defect location deviates from 0.226 only slightly for defocus (0.215) and astigmatism (0.213). Spherical increases the intensity a little (0.253). Trifoil raises the level significantly (0.298) or about 40% of that due to the coma aberration under test. (Making the coma target more rotationally extensive would likely reduce the effect of trifoil while at the same time increasing the sensitivity slightly).

Figure 10:
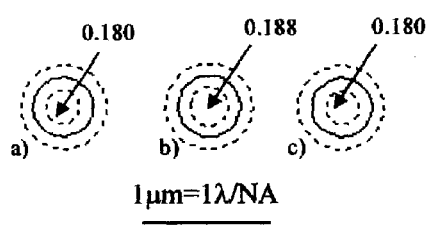
FIG. 10 illustrates intensity contours at 0.05 increments for an isolated programmed defect of size 0.4 λ/NA by 0.4 λ/NA with a) 0.1, b) 0.0 and c) −0.1λ of balanced coma.
Figure 11:
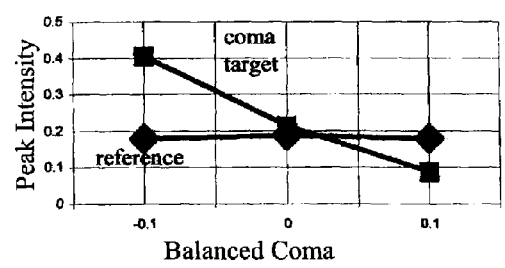
FIG. 11 is a graph of the peak intensity of the coma test target (squares) and the reference isolated programmed defect (diamonds) as a function of waves of balanced coma.

The field of an isolated programmed defect used as a reference is not strongly affected by aberrations. This can be seen in FIG. 10 where the intensity contours are shown for a 0.4 λ/NA by 0.4 λ/NA defect for plus and minus 0.1λ of coma. The presence of the aberration has hardly any effect on the peak height (Strehl ratio) for this small isolated feature. This is in contrast to the behavior of the coma target. This difference is shown rather dramatically in FIG. 11, where the isolated defect peak intensity decreases by only −0.008 with coma, while the peak in intensity of the defect in the coma target changes by a range of 0.30 about its reference level of 0.226. The actual size on the mask of the programmed defect is critical as the reference intensity increases as the fourth power of the linear size (or square of the area). However, the size can be calibrated without measuring the mask itself by simply measuring the intensity of isolated programmed defects. The low sensitivity of the Strehl ratio in FIG. 11 indicates that this can even be done in the presence of moderate levels of residual aberrations. The placement of the defect-probe relative to the feature, while important, is also rather forgiving as all side-lobes typically have a radial width of 0.6 λ/NA and change even more slowly with distance in the azimuthal direction.

Figure 12:
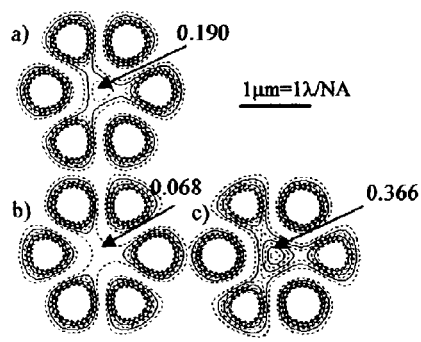
FIG. 12 illustrates intensity contours at 0.05 increments for the trifoil target with a) 0.0, b) 0.1 and c) −0.1λ of trifoil.
Figure 13:
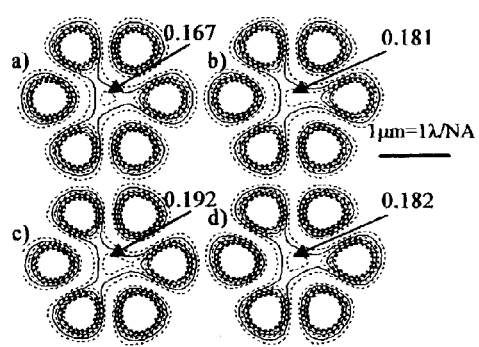
FIG. 13 illustrates intensity contours at 0.05 increments for the trifoil target with 0.1 λ of a) defocus, b) astigmatism (cos), c) –coma (cos) and d) trifoil (30°).

The trifoil target design in FIG. 7 worked even better than the design for the coma target. The target sensitivity is shown in FIG. 12. The zero aberration reference is 0.190 and again a 0.30 clear field intensity swing is observed with the direction of trifoil. The orthogonality is excellent as shown in FIG. 13. Here the worst case is a 12% change in the reference value for defocus. Note that the trifoil target is nearly perfectly orthogonal (<2%) to coma. This likely implies that the coma target could be redesigned to also have nearly perfect orthogonality with respect to trifoil.

Figure 14:
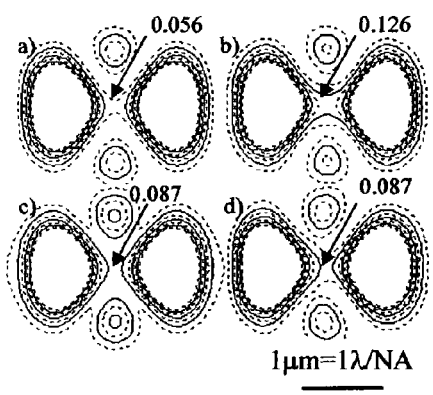
FIG. 14 illustrates intensity contours at 0.05 increments for the astigmatism target with a) no aberration, b) astigmatism (cos), c) defocus, and d) coma (cos) of 0.1λ.

The astigmatism target in FIG. 7 also worked but further improvement is needed. As shown in FIG. 14 the zero aberration level is unfortunately only 0.056. This might be raised to near 0.20 by enlarging the programmed defect so that extreme over-exposure is not needed. Also the minimum is a saddle that may be influenced from lateral development effects from the left and right sides. A 0.1λ level of astigmatism increases the saddle value to 0.126, indicating some but not strong sensitivity. The orthogonality to defocus and coma is marginal as they each individually raise the saddle intensity to 0.087.

Figure 15:
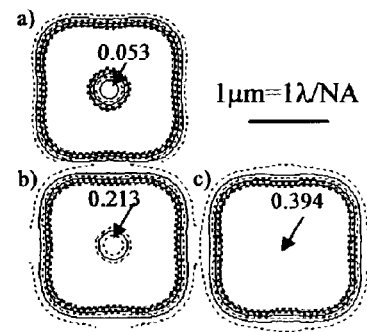
FIG. 15 illustrates intensity contours at 0.05 increments for the spherical target with a) no aberration, b) spherical and c) defocus of 0.1λ.

The spherical target in FIG. 7 worked more effectively as a focus target. As shown in FIG. 15, the zero aberration reference value is again rather low at 0.053. Defocus also clearly encroaches more than spherical aberration and raises the intensity to 0.394 versus 0.213. A redesign is in order but simulation of a few different sizes did not reveal natural improvements.

The results for the above four defect-probe based targets as well as the halftone knife-edge are summarized in Table II. The targets are listed in the columns. The second row gives the reference for each of the targets. The rows other than the one labeled reference give the intensity change relative to the full clear field level for a positive 0.1λ of each of the Zernike aberrations through third order spherical. The underlined values highlight the sensitivity to the design aberration as well as the problematic issues discussed earlier with respect to orthogonality to other aberrations.

TABLE II

Reference level and response of each of the defect-probe based aberration targets to 0.1 λ of the Zernike aberrations 3 through 11.

| Target | Coma | Astig | Trifoil | Spher | HT |
|---|---|---|---|---|---|
| Reference | 0.226 | 0.056 | 0.190 | 0.053 | 0.121 |
| Defocus | −0.011 | 0.029 | −0.023 | 0.341 | |
| Astig(sin) | −0.013 | 0.002 | −0.011 | 0.013 | 0.000 |
| Astig(cos) | −0.017 | 0.070 | −0.009 | 0.022 | −0.001 |
| Coma(sin) | − 0.006 | −0.012 | −0.007 | 0.032 | 0.000 |
| Coma(cos) | −0.137 | 0.029 | 0.002 | 0.032 | −0.072 |
| Trifoil(sin) | 0.073 | 0.002 | −0.008 | 0.010 | |

TABLE II-continued

Reference level and response of each of the defect-probe based aberration targets to 0.1 λ of the Zernike aberrations 3 through 11.

| Target | Coma | Astig | Trifoil | Spher | HT |
|---|---|---|---|---|---|
| Trifoil(cos) | −0.011 | 0.021 | −0.122 | 0.010 | |
| Spherical | 0.027 | 0.032 | −0.023 | 0.160 | −0.005 |

The printed artifacts induced by the programmed defect-probes are suitable for reading with either manual or automatic inspection. The size and locations of these artifacts are known in advance. They are about ⅔ of the working resolution in size and spaced from the feature by about 0.6 λ/NA. Thus they are easy to identify as either present or absent without having to measure either feature size or position shift. While over exposure is required to print these artifacts, the large dynamic range of the side-lobe height with the level of aberration allows exposure steps on the order of 4% of the normal exposure dose to be utilized. The number of targets and target orientations per aberration is small. An array of locations throughout the field could be measured with automatic optical wafer inspection equipment in the time comparable to the 20 minutes for 121 field locations reported by Imai et al. [8].

For asymmetrical aberrations, an exposure matrix at best focus is sufficient. The dose-to-print levels should be read for the reference programmed defect (FIG. 11) as well as both the defect and its anti-symmetric orientation (as in FIG. 8). The former calibrates the programmed defect size on the photomask. The latter gives two statistically independent readings of the level of the aberration. With N exposure levels, M sized targets in O orientations the measurement accuracy A of each aberration is $$A = \frac{(0.1 \text{ waves})}{\left(\left(\frac{N}{2}\right)(2OM)^{1/2}\right)}$$

In summary, it is seen that the side-lobes of small dark-field features tend to grow linearly with the waves of aberration rather than as the square of the waves of aberration as do the peak intensities (dark field) or minimum intensities (clear field). A defect-probe placed in the side-lobe of a feature can produce an interferometric-like reference electric field that combines in a coherent manner with the feature spillover to greatly enhance the local intensity produced by the aberration. Using the point-spread electric field as a guide, sets of features can be chosen that enhance the response of the programmed defect-probe. The rotational order of each aberration can be invoked to improve the orthogonality to the presence of other aberrations not under test by a given target. A super-sized defect on the order of ⅔ of a feature size can be used to set the reference intensity level at 20% of the clear field value to allow constructive and destructive variations and remain above any background intensity level. Simulation showed that for a 180° phase-shift between the feature and the defect-probe, odd aberrations (coma and trifoil) produced an intensity swing of 30% of the full clear field as the orientation of 0.1λ of the appropriate aberration was rotated. The trifoil target showed an intensity change to all other individual aberrations of at most 12% of the swing produced by trifoil itself. It is anticipated that the exposure level at which these artifacts first appear can be used with either manual or automatic inspection to determine the presence of aberrations to an accuracy of 0.01λ. The targets for even aberrations (defocus, astigmatism, spherical) performed poorly with only 1800 phases, but warrant further study with 90° phased defect-probes for which the probe electric field will be in phase with the perturbation of the field created by the presence of even aberrations.

Figure 16:
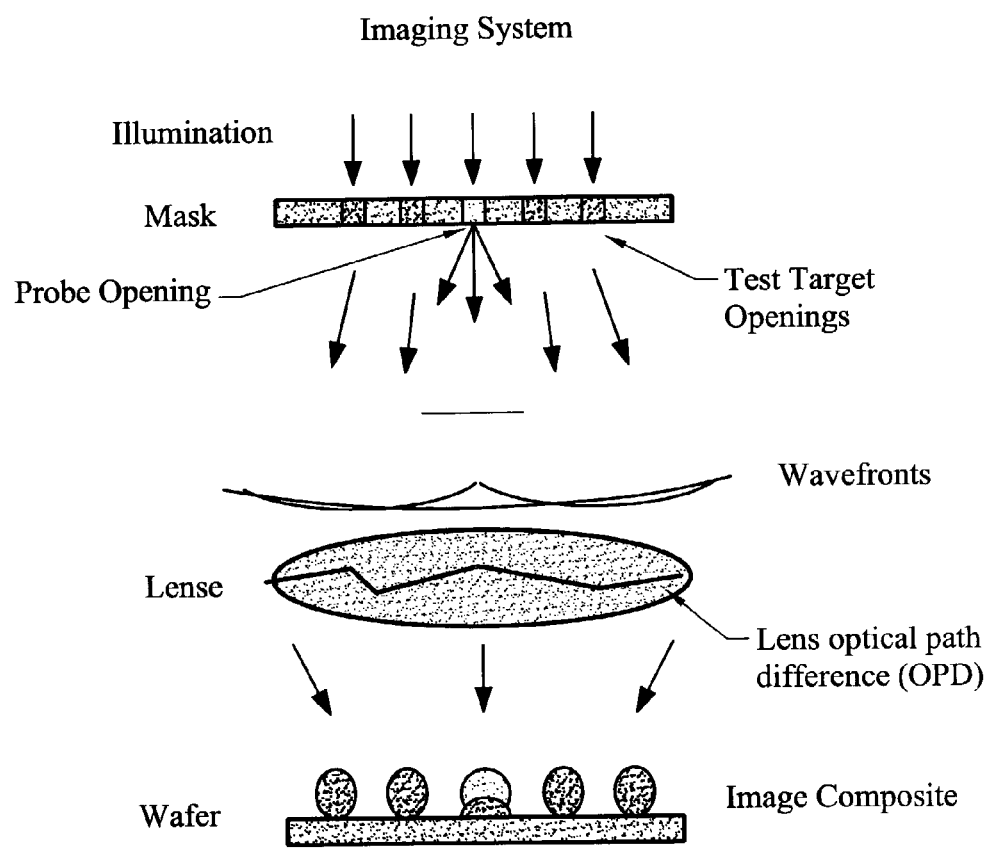
FIG. 16 illustrates an optical system with illumination, mask, lens, and wafer showing the probe and aberration test pattern on the mask, the diffraction spectra, the lens optical path difference, and the converging spectra and the individual and composite images at the wafer.

A formal theoretical analysis of the optimum test pattern shape will now be made. Consider now a generic optical projection printing system consisting of a coherently illuminated mask, a lens, and the image (wafer) plane is shown in FIG. 16. The light diffracted by the mask with Cartesian coordinates (x,y) emanates in a diverging spectrum of plane waves toward the lens. Note that, as depicted in FIG. 16, this spectrum is a superposition of electric fields from both the probe acting as a point source producing a uniform spherical wave front and the surrounding test target features that produce a non-uniform wave front. These two spectra of plane waves can be considered to be processed independently by the lens to determine their electric field contributions at the wafer.

The lens acts as a low pass filter that collects only the plane waves that travel at an angle less than its maximum collection angle. The nonideality of the lens is modeled as a function of pupil coordinates (p, θ) as the optical path difference (OPD). A perfect lens captures diverging spherical waves and converts them into converging spherical waves. For a lens with aberrations, the OPD describes the phase error between the actual aberrated wavefront that emerges and the ideal spherical wavefront from an unaberrated lens.

The probe is sized sufficiently small that by itself it will not print. When the electric field contribution from the surrounding pattern is added to the electric field from the probe itself at the probe position on the wafer, the intensity is significantly altered and a contact hole like shape may print in positive resist. This new intensity can be calculated as the square of the sum of the electric field contributions, assuming that the mask illumination is sufficiently coherent across the test pattern and that the probe and pattern contributions are of the same temporal phase.

A formal integral representation of the electric field at the image (x',y') can be developed following the approach and notation of Born and Wolf. The resulting normalized electric field at the image $E_{image}(x',y')$ is given by $$E_{image}(x', y') = \frac{1}{\pi}\int_0^{2\Pi}\int_0^1 E_{diff}(\rho, \theta) x_e^{ik[\Phi(p,\theta)+p\cos(\theta)\lambda'+p\sin(\theta)y']}\, pd\, pd\, \theta$$

Here, Φ(p, θ) is the OPD across the pupil, and since Φ(p, θ) can contain defocus there is no loss of generality in not including an axial position z. The diffraction spectrum from the mask $E_{diff}(p, \theta)$ contains both the probe and test target waves. The limits of integration cover the pupil, which has been normalized to a radius of unity. The parameter k is 2πλ.

The OPD is assumed to be sufficiently small to permit a Taylor series expansion of the exponential phase keeping only the linear term. The target spectrum arriving at the pupil is expanded in a Zernike representation as well. By moving the observation point to the center of the target on the wafer (x=0,y'=0) the additional exponential is also removed. The orthonormal properties of the Zernike representation are then invoked to eliminate cross terms between the probe and the OPD as well as that from the spectrum from the surrounding feature and the unaberrated (diffraction limited) pupil. The resulting electric field intensity at the center of the target normalized to a clear field of unity is $$E_{image}(0, 0) = k_3 A e^{i\phi} p + i \frac{D_{T,n,m} A_{n,m}}{\pi(n+1)}$$

Here A is the area of the probe, $\phi_p$ is the phase of the probe region when a phase-shifting mask is used, and $k_3$ is the same normalization constant used to model the electric field intensity of the image of a small defect. $A_{n,m}$ is the amplitude of the Zernike aberration under study and n and m are its radial and azimuthal integer orders. $D_{T,n,m}$ is the complex amplitude of the n,m order of the Zernike expansion of the fields arriving in the pupil from the surrounding target pattern. Incidentally, these far fields in the pupil are the Fourier transform of the mask pattern and hence for surrounding test patterns with even (odd) symmetry $D_{T,n,m}$ is real (imaginary).

The extremes of the intensity normalized to a clear field value of unity and the diffraction limited probe intensity $$I_{total\ max\_or\_min}(0, 0) =$$
$$\left(k_3 A \pm \frac{|D_{T,n,m}|A_{n,m}}{\pi(n+1)}\right)^2 \approx I_{ideal\_p} \pm 2\sqrt{I_{ideal\_p}} \times \frac{|D_{T,n,m}|A_{n,m}}{\pi(n=1)}$$

Equations (2) and (3) give physical insight into the interaction of the target with the probe. First, the phase of the probe can be adjusted ($\pi/2$ for even aberrations where $D_{T,n,m}$ is real and $\pi$ for odd aberrations where $D_{T,n,m}$ is imaginary) to make the interaction of the target with the probe collinear in an additive or a subtractive manner to produce the two extremes of intensity. Second, the perturbation of the intensity is directly proportional to the product of the diffraction from the target into the Zernike under test and the level of the aberration in the lens $A_{n,m}$. Equation (2) describes more general cases such as occur in binary masks for which one term is real and the other is imaginary, combining in quadrature in the complex plane. The combined intensity for this case is thus the sum of the intensity for an isolated probe in a diffraction limited lens and the intensity produced in the center of the test target without the probe. Equation (2) also indicates that when the probe is phased so that it adds with nearly the same temporal phase as that from the test pattern the magnitude of the combined (nearly co-directional) electric field is rather insensitive to as much as a 10° phase error between the probe and target.

The physical characteristics of the surrounding test targets on the mask can now be determined from their behavior required in the pupil to react with individual Zernike terms. Due to the completeness and the orthogonality of the Zernike polynomials, the best target for detecting the $Z_{n,m}$ (p,θ) aberration is a target $E_{Tn,m}(x,y)$ whose far field Fourier transform(FT) behavior at the pupil is proportional to $Z_{n,m}$ (p,θ). Taking the inverse of this Fourier transform, the physical field produced by the surrounding mask pattern $E_{Tn,m}(x,y)$ is thus the inverse Fourier transform (IFT) of the assumed pupil distribution $Z_{n,m}(p,\theta)$. While the resulting function is continuous and takes on both negative and positive values (and is thus difficult to realize) it can be said to be an optimum mask pattern. This is because it produces far fields in the pupil that are perfectly orthogonal to other aberrations while at the same time giving the maximum on-axis electric field contribution per unit of energy diffracted into the pupil.

The well-known characteristics of the Zernike aberrations, allow many of the general properties of the test targets to be deduced in advance. For example, the test targets will all have a zero on axis, grow in radius with the radial order and have ripples at a period $\lambda/(2\ NA)$ with finite slopes. These follow from the Zernike polynomials having zero pupil-weighted area, a number of zero crossings that grows with the radial order, and a bandwidth limit due to the finite pupil size.

An efficient way of developing test targets that address the problem of separating radial aberration effects is to examine the inverse Fourier transforms of the different radial orders of Zernike aberrations. An integration routine was written in MATLAB for this purpose. FIG. 2 shows $E_{T,n,m}(x,y)$ on the mask for no aberration ($Z_{0,0}$), defocus ($Z_{2,0} \equiv Z_3$), spherical ($Z_{4,0} \equiv Z_8$), and higher-order spherical ($Z_{6,0} \equiv Z_{15}$). Here the subscript pairs use the convention of Born and Wolf[18] The normalization is such that the aberration is one at the pupil edge and either magnitude one (even aberrations) or zero (odd aberrations) at the pupil center. A plot on a radial cut line along the x-axis is shown in FIG. 18.

Figure 18:
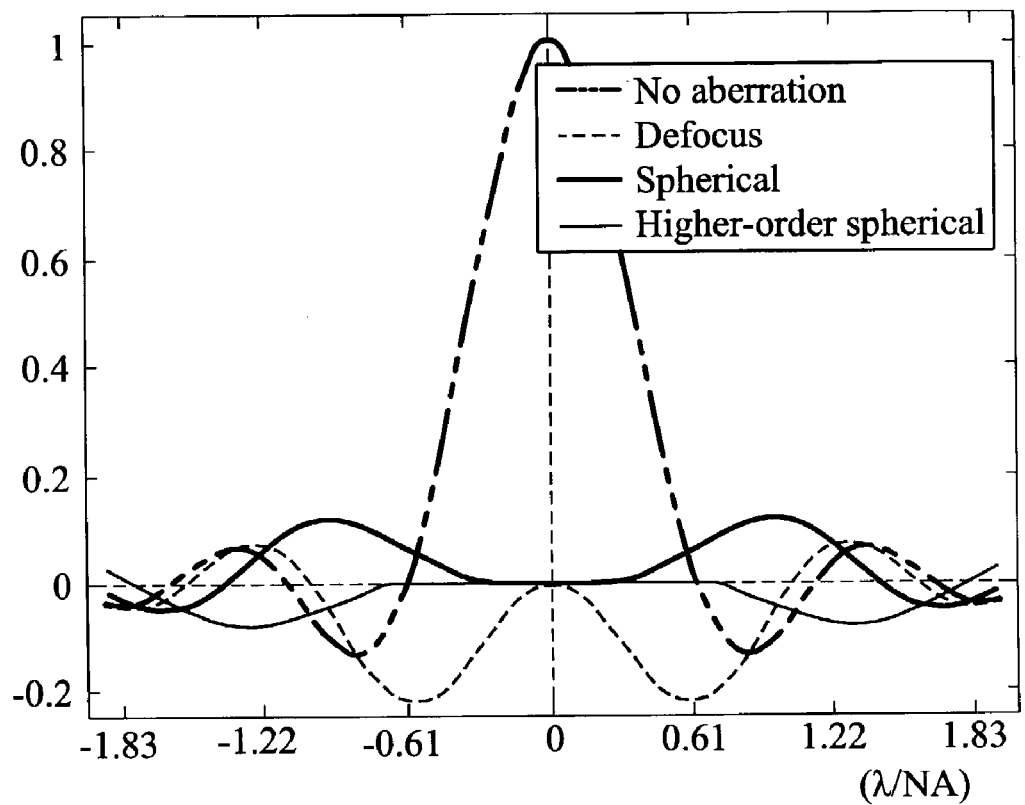
FIG. 18 is a graph of the electrical field at the mask along the x-axis for the optimum targets in FIG. 2.

The examples of optimum mask test target electric fields $E_{T,n,m}(x,y)$ in FIGS. 17 and 18 clearly show the fundamental properties inherited from the Zernike polynomials. All but the uniformly filled pupil have a zero on axis surrounded by a sizable dark area, thus providing a natural location for a probe. As a point of reference the first null of the uniformly filled pupil is at a radius of 0.61 $\lambda/NA$. The electric field is real and requires both negative (180° phase shifted) and positive (unshifted) target rings. The bright areas of the targets grow in radial size as the order increases. They are located at 0.57, 0.93, and 1.31 $\lambda/NA$, respectively. The ripple distance is similar in all of the figures and is on the order of $\lambda/(2\ NA)$ corresponding to the interference of waves from the edges of the pupil.

Figures 19A, 19B:
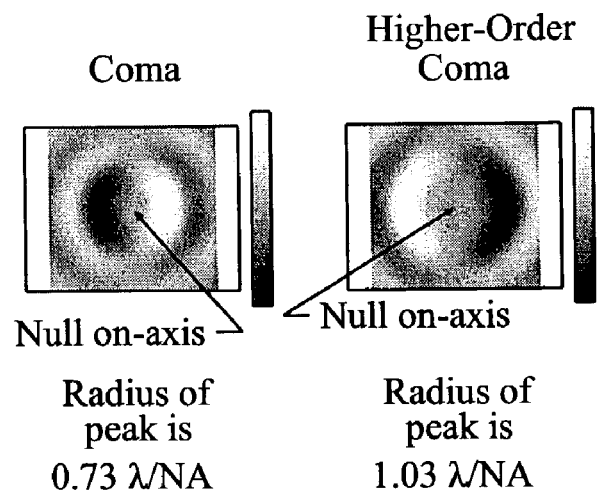
FIGS. 19A, 19B illustrate two-dimensional inverse Fourier transforms of pupil distributions for the cases of a) coma ($Z_{3,1}$) and b) higher order coma ($Z_{5,1}$).
Figure 20:
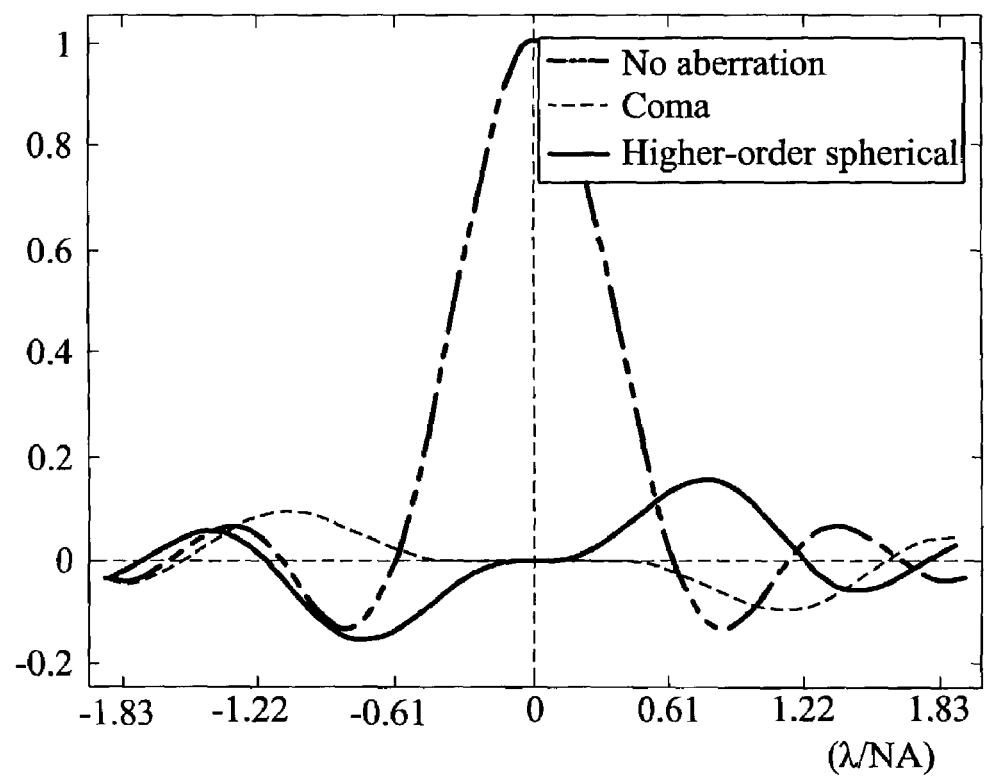
FIG. 20 is a graph of the electrical field at the mask along the x-axis for the optimum targets in FIG. 17.

FIGS. 19A, 19B shows intensity plots for balanced coma ($Z_{3,1} \equiv Z_6$) and higher-order coma ($Z_{5,1} \equiv Z_{13}$). An intensity plot on a radial cut line is shown in FIG. 20. Again each of the targets has a sizable dark area at its center. In this case the electric fields are imaginary and antisymmetric about the pattern center on the mask. The radius of the bright area increases with the radial order and the interference ripple is again on the order of $\lambda/(2\ NA)$, occurring at 0.76, and 1.14 $\lambda/NA$, respectively.

Figure 21:
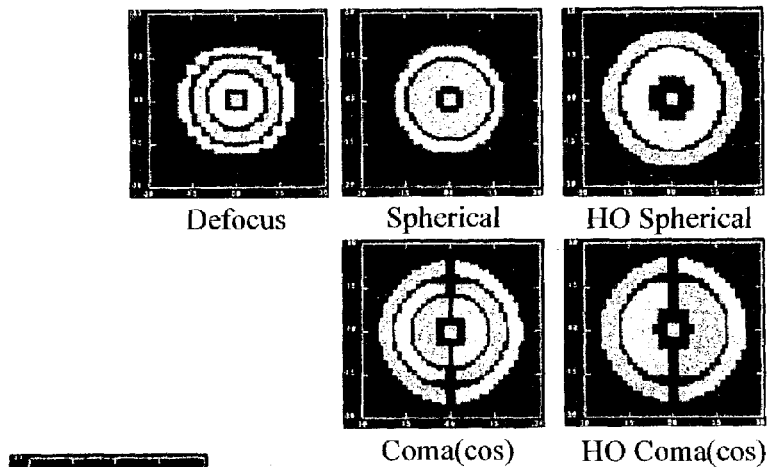
FIG. 21 illustrates implementation of the targets in FIGS. 2) and 4) with probes by means of 100% transmitting areas with alternating phases.

Three radially symmetric and two first order rotational test targets were laid out by hand by approximating the negative and positive electric fields as regions with transmission of unity with either 180° or 0° phase. These layouts are shown in FIG. 21. Here the lighter color is 0° phase. The layouts intentionally use a fairly high degree of detail and thus test the up-side potential of the approach. To assess the performance possible the images were simulated with SPLAT[19]. The inputs to SPLAT were normalized such that the Zernike aberration corresponded to a peak edge optical path difference of 0.05$\lambda$. The simulations used $\lambda$=0.5 μm and NA=0.5 so that 1 μm in the figures equals 1 $\lambda/NA$. A small but finite partial coherence factor σ of 0.1 was used.

Figure 22:
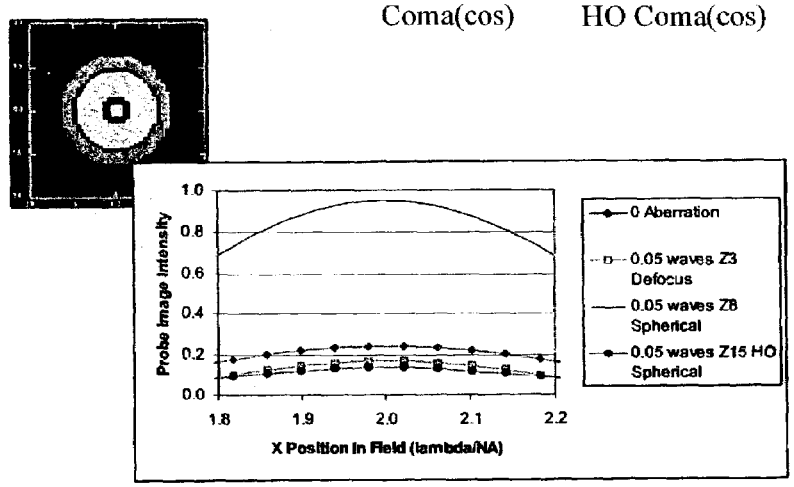
FIG. 22 illustrates image intensity versus position for the spherical target in the vicinity of its center for fixed levels of various aberrations.

The detailed image response in the vicinity of the center of the image on the wafer plane for the spherical target for various aberrations at the 0.05$\lambda$ peak level is shown in FIG. 22. The local image is similar to the image of an isolated pinhole and has a lateral dimension comparable to that of a contact hole. This fundamental shape is magnified or demagnified by various aberrations.

Without any aberrations the peak is at an intensity of 0.242 of the clear field intensity. When only defocus is used, the intensity at the probe position decreases to 0.168 of the clear field. With only higher-order spherical, a decrease to 0.135 is observed. When spherical aberration alone is included this peak rises to 0.955, or by over 70% of the clear field intensity.

For the $Z_3$, $Z_8$, $Z_{15}$, $Z_6$, and $Z_{13}$ targets the values of the change in probe image intensity for 0.05λ of peak aberration are 0.823, 0.713, 0.677, 0.587, and 0.390. When normalized by the appropriate peak-to-rms conversion factor for the given Zernike terms $\sqrt{3}$, $\sqrt{5}$, $\sqrt{7}$, $\sqrt{8}$, and $\sqrt{12}$, the sensitivities can be stated as 0.285, 0.139, 0.358, 0.332, and 0.270 per 0.01λrms aberration. The cross contamination of the spherical target by 0.05λ peak of defocus and higher-order spherical are, in the worst case, only about ⅙ of the target's sensitivity to spherical aberration. This is a test target that is both highly sensitive to spherical aberration as well as nearly independent of focus.

Figure 23:
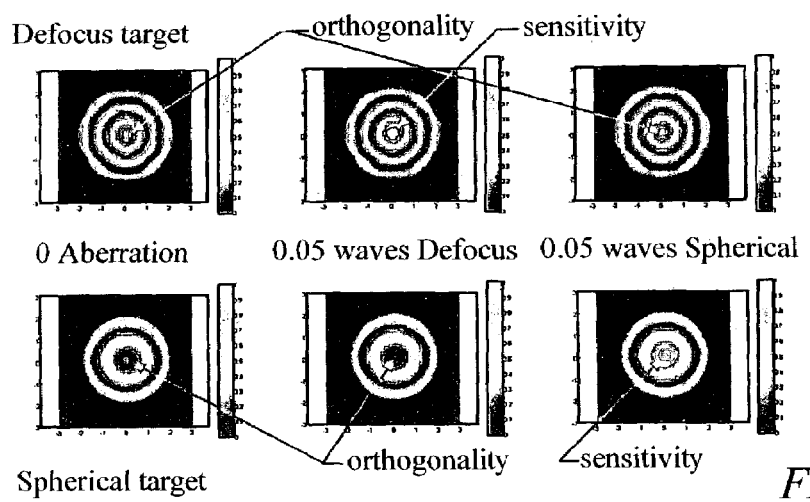
FIG. 23 illustrates images at the wafer plane for the defocus and spherical targets for no aberration, and 0.05λ peak of defocus and spherical.

FIG. 23 shows images at the wafer plane of the defocus and spherical targets for three lens quality conditions. The spherical target clearly shows that it is dark at the center with no aberration and remains dark in the presence of defocus. However, when spherical aberration is present a bright dot appears at the center of the target. The defocus target behaves in a similar manner but the change is a little more difficult to visualize due to the high starting peak level at the center of the target.

Figure 24:
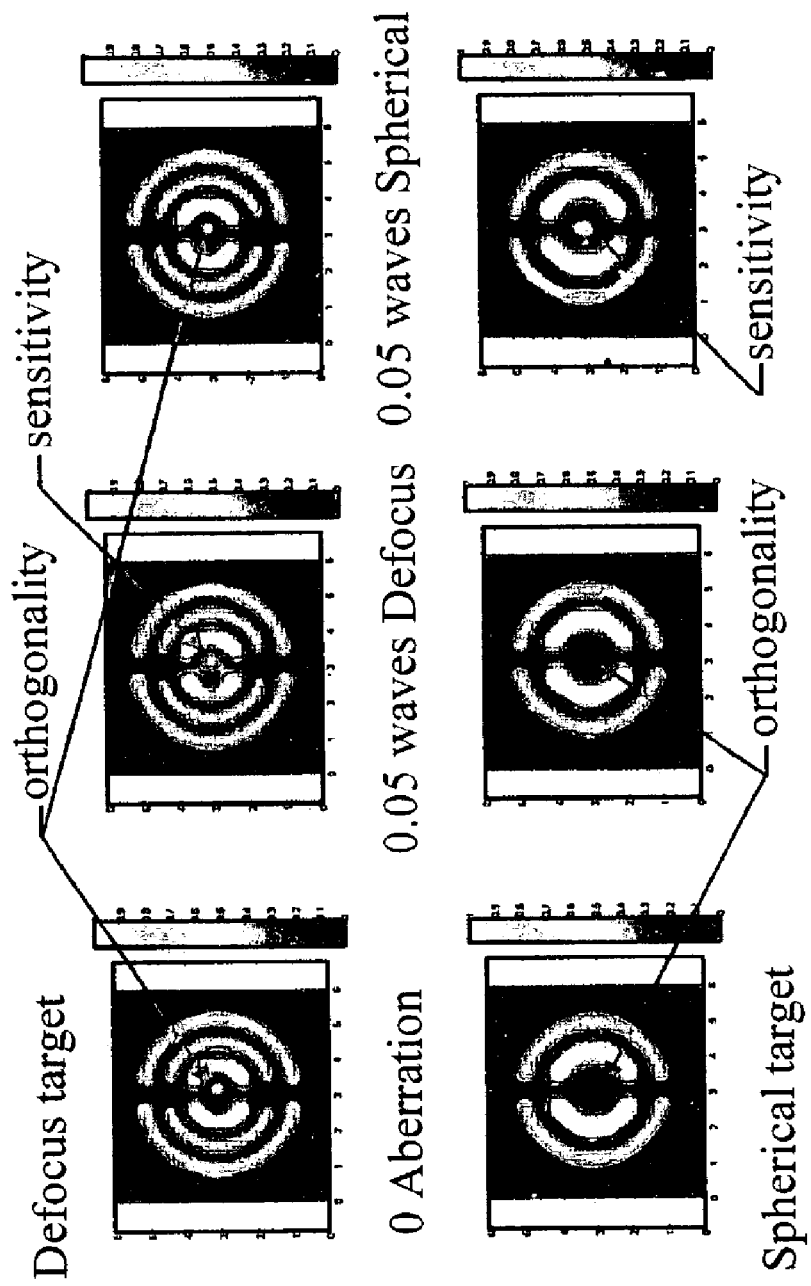
FIG. 24 illustrates images at the wafer plane of the coma and higher-order coma targets for no aberration, and for 0.05λ peak of coma and higher-order coma.

FIG. 24 shows images at the wafer plane of the coma ($Z_6$) and higher-order coma ($Z_{13}$) targets for three lens quality conditions. The higher-order coma target clearly shows that it is dark at the center with no aberration and remains dark in the presence of coma. When higher-order coma is present a bright dot appears at the center of the target. The coma target behaves in a similar manner but the change is slightly more difficult to visualize due to the moderate level of the central peak with no aberration.

From the foregoing, three radially symmetric and two first order rotational test targets were systematically tested for sensitivity and orthogonality by observing the change in the on-axis image intensity from the unaberrated cases in the presence of a 0.05λ peak value of the corresponding five aberrations. The results are shown in Table 3. Here each column corresponds to one of the test targets and each row corresponds to an aberration condition. The entries for the "no aberration" row are the reference levels of the peak value at the center of the target normalized to a clear field intensity of one. The entries for the aberration rows show the change in this peak value as a fraction of the clear field value due to the introduction of 0.05λ peak of that aberration. The results are grouped by rotational symmetry of the aberrations to emphasize the radial effects within each symmetry class.

TABLE 3

Summary of the target sensitivity and orthogonality. Each target in FIG. 6 is shown in a column and each row is for a 0.05 λ peak level of a given aberration.

| σ = 0.1 | Targets | | | | |
|---|---|---|---|---|---|
| δ-peak with 0.05 waves of | Defocus | Spherical | HO Spherical | Coma | HO Coma |
| No Aberration | 0.933 | 0.242 | 0.207 | 0.555 | 0.222 |
| Defocus | +0.823 | −0.074 | −0.064 | +0.060 | <|−0.01| |

TABLE 3-continued

Summary of the target sensitivity and orthogonality. Each target in FIG. 6 is shown in a column and each row is for a 0.05 λ peak level of a given aberration.

| σ = 0.1 | Targets | | | | |
|---|---|---|---|---|---|
| δ-peak with 0.05 waves of | Defocus | Spherical | HO Spherical | Coma | HO Coma |
| Spherical | <+0.01 | +0.713 | 0.115 | +0.020 | <+0.01 |
|  | −0.143 | −0.107 | +0.677 | <+0.01 | +0.013 |
| Coma | +0.034 | +0.018 | <+0.01 | +0.587 | −0.063 |
| HO Coma | <+0.01 | <+0.01 | +0.013 | −0.012 | +0.390 |

The goal for the unaberrated peak value was 20%–25% of the clear field intensity and three of the targets meet this goal. Unfortunately the targets with the lowest order radial variation are considerably higher (at 0.555 for coma and 0.933 for defocus), owing to their very limited on-axis null. The diagonal shows the sensitivity of each target to the aberration for which it was designed. In all cases the targets have been phased such that the aberration increases the intensity at the probe. The magnitudes of the increases are impressively large at 0.390–0.823. When renormalized, all five cases show a sensitivity of between 27% and 36% per 0.01λrms of the associated aberration. Most of the off diagonal terms are negligible and even the most similar aberrations are in the worst case only about ⅙ as large as the main effect.

Initial testing of target performance was conducted for odd aberrations using the 0 and 180 degree phase shifted openings available on a phase shifting mask. The images were printed versus exposure dose at a wavelength of 193 nm with a NA of 0.55 in a 4× system. For reference an isolated probe, shown in (FIG. 25) printed at a dose of between 20 and 22 mJ/cm2. FIG. 26 shows an scanning electron micrograph (SEM) of two coma targets directly above two higher-order coma targets exposed at a dose of 16 mJ/cm2. While the pattern rings of the upper targets have begun to merge together and a spot which appears to be the probe has merged with the innermost ring, the lower targets show now such merging and their center areas are completely unexposed. FIG. 27 shows the same set of targets as seen in FIG. 26 exposed with a dose of 18 mJ/cm2. The upper targets in this exposure show increased merging but the lower targets remain sharply defined and, more importantly, a small dot appears in the photoresist at the target center. This means that at a dose of 18 mJ/cm2 the wavefront created by the target on the mask interacted with the aberration in the projection lens so as to spill enough energy into the central probe position to raise the dose in that area above the 20–22 mJ/cm2 needed to print the probe.

Aberration levels are quantified in lenses by measuring the central intensity peaks of these targets directly with optical detectors or through inspecting photoresist images printed at various exposure doses. Simpler targets may be used in practice, with some but not a large loss of sensitivity and orthogonality. Mask making tolerance requirements have been examined for simpler targets elsewhere and are generally within the capability of mask making.

The pattern and probe based aberration monitors proposed above each consist of a nominally sub-printable probe (⅔ minimum feature size, or ~0.4 λ/NA), surrounded by a target ring pattern. The fields from the pattern rings interact with the aberrations in the lens and spill light over into the central probe region in the image plane as seen in FIG. 28. From basic Fourier optics and the time-invariance of imaging systems, it is known that, for coherent imaging, if a δ-function in intensity is present at the image (wafer) plane and passes backwards through the lens, the resultant electric field at the object plane is the scaled Fourier transform of the generalized pupil function, or the aberrated point spread function (PSF) of the system. Thus, if an electric field equivalent to the aberrated PSF of the system is generated at the object (mask) plane, a δ-function in intensity will be observed in the image plane. It is thus possible to create a pre-aberrated wavefront at the entrance pupil that interacts appropriately with the aberrations in the lens to create an unaberrated wave at the exit pupil.

In general the field arriving at a given point in the image plane is the integral over the pupil of the fields incident upon the lens multiplied by the generalized pupil function of the lens. In an imaging system the electric field at the entrance pupil is the Fourier transform of the object. The generalized pupil function is the product of the finite support function of the ideal pupil and a phase term that incorporates the path length error introduced by aberrations. If the aberrations are small a Taylor series expansion of this phase term is permitted. In both one and two dimensions it is possible to express the both the field incident upon the lens and the total aberration in the lens as a sum of orthonormal functions with appropriate magnitudes. The orthogonal properties of the basis functions can then be invoked and the final result is that the ideal pattern in the object plane required to pre-aberrate the wavefront at the entrance pupil, for the purposes of interacting with a single term in the sum describing the aberration, is the Fourier transform of the product of the aberration term of interest times the finite support function of the lens. The deal target is thus the convolution of the Fourier transform of the aberration term with the Fourier transform of the lens' finite support function.

Ideal Target=FT{aberr.term×finite lens support}=FT{aberr.term}FT{finite lens support}

In the two-dimensional case, the fields arriving at the image plane are given by $$E_{Image\_\pi}(x', y') = \frac{1}{\pi} \int_0^{2\pi} \int_0^1 E_{Diff}(\rho, \theta) P(\rho, \theta) \rho d\rho d\theta$$

where ρ and θ, are the pupil coordinates, $E_{Diff}(\rho,\theta)$ is the field diffracted from the object and incident upon the lens, and $P(\rho,\theta)$ is the generalized pupil function of the lens, including amplitude and phase variations. It is of particular mathematical convenience to describe the angular and radial components of the wavefront deviation at the entrance pupil in terms of Zernike polynomials. The advantage of the pattern and probe based aberration measurement technique is that a series of individual targets can be designed, each of which is extremely sensitive to one Zernike aberration while showing good orthogonality (low sensitivity) to other aberrations.

When considering lenses with high Strehl ratios, the exponential term in the generalized pupil function can be expanded in a Taylor series, yielding $$P(\rho, \theta) = P(\rho, \theta)e^{jk\phi(\rho,\theta)} \approx P(\rho, \theta)(1 + jk\phi(\rho, \theta)).$$

Here, $P(\rho,\theta)$ is the unaberrated pupil function (0 outside the pupil and generally unity inside) and k=2π/λ. Expanding both the aberration function, $\Phi(\rho,\theta)$, and $E_{Diff}$ over the pupil in Zernike polynomials, and invoking the orthonormal properties of the Zernike functions allows the elimination of two of the four terms in the diffraction integral. The final form of the integral indicates that the ideal target for high sensitivity to one specific Zernike aberration and minimal sensitivity to other aberrations is as the Fourier transform of the Zernike term of interest over the pupil.

Insight into the complex results of the two-dimensional case can be attained by analyzing the one-dimensional case. While the Zernike polynomials form a complete orthonormal set over the unit circle, the analogous orthonormal basis in one dimension is composed of the complete set of sines and cosines. These functions are analogous to the Zernike representation in that radial variation is oscillatory and the n-fold rotational symmetry of the Zernikes reduces to odd (sin) and even (cos) functions. To make the range finite as occurs in two-dimensions over the pupil these functions must be multiplied by a finite lens support function. The ideal target is thus the Fourier transform of this product and can be expressed as the convolution of the FT of the aberration function convolved with the Fourier transform of the finite lens support as given above in [116].

Figure 29A:
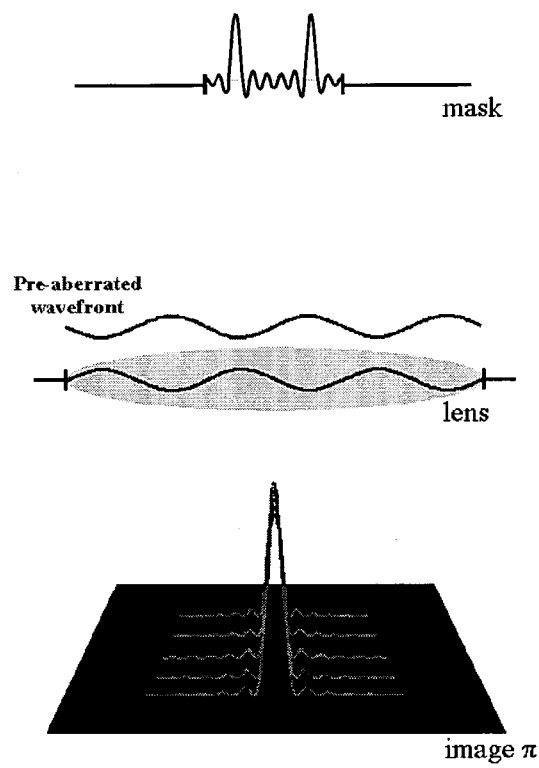
FIG. 29A is a simplified one-dimensional aberration model.
Figure 29B:
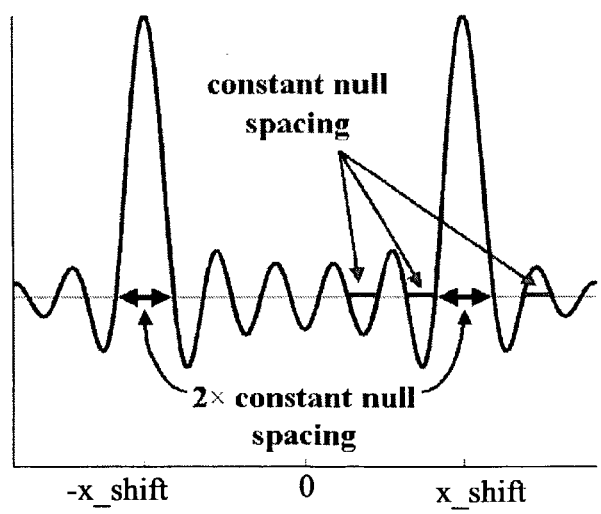
FIG. 29B is a Fourier transform of a single cosine aberration over a spatially limited one-dimensional pupil.

In the following discussion it is assumed that coordinates in the pupil are in frequency space ($k_x$) and coordinates in the object plane are in physical space (x). Consider for example the case as seen in FIG. 29A where the aberration is simply a single cosine term over the supporting rect-function of the lens. The cosine-function can be expressed as the sum of two complex exponentials and its Fourier transform is the sum of two δ-functions, each shifted equally from the origin as shown in FIG. 29B. The Fourier transform of the rect-function is simply the sinc-function, which has a central lobe that is two times as wide as its sidelobes. The optimum fields from a target in the object plane for this one-dimensional aberration are then given by $$\text{Ideal Target} = FT\left\{\cos\left(\pi n \frac{k_x}{r_{p,k}}\right) \times rect\left(\frac{k_x}{2r_{p,k}}\right)\right\} =$$

$$FT\left\{\frac{1}{2}\left(\exp\left(j\pi n \frac{k_x}{r_{p,k}}\right) + \exp\left(-j\pi n \frac{k_x}{r_{p,k}}\right)\right)\right\} \otimes FT\left\{rect\left(\frac{k_x}{2r_{p,k}}\right)\right\}$$

where $\gamma_{p,k} = \kappa_0 NA = \frac{2\pi}{\lambda}NA$ is the radius of the pupil in k-space. This yields a target that is essentially the sum of two shifted sinc-functions.

$$\text{Ideal Target} = \left[\frac{1}{2}\delta\left(x - \frac{n}{2r_{p,k}}\right) + \frac{1}{2}\delta\left(x + \frac{n}{2r_{p,k}}\right)\right] \otimes 2r_{p,k}\text{sinc}(2r_{p,k}x) =$$

$$r_{p,k}\left[\text{sinc}\left(2r_{p,k}x - \frac{n}{2r_{p,k}}\right) + \text{sinc}\left(2r_{p,k}x + \frac{n}{2r_{p,k}}\right)\right]$$

The order of the aberration, n=±1,±3,±5, . . . , defines the frequency in k-space at which the induced wavefront error oscillates over the lens. Thus, the peak-to-peak spacing of the aberration in the lens, $\Delta k_x$, as seen in FIG. 27A can be given by $$\Delta k_x \approx 2\pi \frac{r_{p,k}}{n}.$$

From the above it is clear that the spacing between the two wide central lobes of the two sinc-functions, Δx, comprising the optimum aberration target seen in FIG. 30B, increases linearly with n, yielding a constant $\Delta k_x \Delta x$ product. Because the sidelobes of the sinc-function decrease as $1/\pi x$, their contribution to the ideal one-dimensional target at the central lobe position of the conjoined sinc-function is small and the final target shows the two double-wide or "fat" central lobes, one from each sinc-function.

As seen in FIG. 29B the dominant electric field contribution comes from the two strong central peaks separated by a distance Δx in the object plane. In an imaging system, for a structure of period Δx, the Fourier components of the scattered light are known to be separated by $$\Delta k_x = \frac{2\pi}{\Delta x}.$$

This agrees with the previous discussion and indicates that the characteristic target size increases linearly with the frequency of oscillation of the aberration in the lens. Intuitively it can be argued that the two wide central lobes are similar to Young's double slits, with their diffracted fields interfering at the pupil. If a given aberration oscillates rapidly over the lens then the "slits" must be placed wide apart to sample the lens at appropriately short intervals. If the aberration varies less rapidly then the slits must be brought closer together to increase the separation of the interference fringes.

While an ideal aberration target would be infinite in extent and have a smoothly varying electric field, mask making currently constricts their implementation to three phases with binary transmission. The targets examined thus far are similar to that shown in FIG. 28 and have a maximum of three rings, with a lateral dimension of ~6 λ/NA. Because they are spatially limited and approximate the ideal smoothly varying sinusoidal electric field transmission with a square wave (FIG. 32), the targets examined thus far show higher-order effects that require investigation.

The first few terms in the Fourier series of a square wave of amplitude k=1 (corresponding to a unity transmission coefficient in the open areas of the mask) are given by $$f(x) = \frac{4k}{\pi}\left(\sin(x) + \frac{1}{3}\sin(3x) + \frac{1}{5}\sin(5x) + \ldots\right)$$

This indicates that approximating a sinusoid with a square wave overdrives the fundamental frequency by a factor of $$\frac{4}{\pi}.$$

On one hand the square wave synthesis is beneficial in that the sensitivity of the target to the aberration it is designed to detect is increased, due to the increased signal at the fundamental frequency. On the other hand this expansion shows that detrimental effects arise in this implementation of the targets in the form of higher frequency terms. Higher order terms each produce a field at the pupil plane that is a convolution of a sinc-function (from the Fourier transform of the finite support function of the target on the mask) convolved with two δ-functions (arising from the sinusoid itself), each shifted laterally by an amount proportional to the order number. While these higher order peaks tend to fall outside of the collection angle of the imaging lens, the sinc-function extends to infinity and a number of its sidelobes are incident upon the lens. The majority of the fields from the sidelobes act as sources of noise. When the fields from these sidelobes interact to change the magnitude of the field at the position of the δ-functions in k-space of the fundamental frequency, cross-talk results between the target and higher order aberrations. This necessitates a recalibration of the target sensitivity to the aberration of interest.

Simulation has shown that cross talk between the lower order two-dimensional aberration targets is a maximum of approximately ⅙. Further investigation is still required, but it is believed that this is this number arises from the fact that the $n^{th}$ order in the expansion of a square wave has 1/n times the magnitude of the fundamental frequency and because the sinc-function decreases as the 1/x distance from its central peak and it is shifted from the pupil center by a distance proportional to n. Thus the n=±3 order would drive the $3^{rd}$ order aberration, resulting in excess fields contributing to the measured signal in the amount of $$2 \times \frac{1}{3} \times \frac{1}{3}.$$

Figure 32:
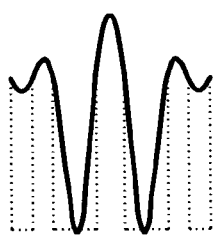
FIG. 32 is a 2-D cut line of the ideal smoothly varying electric field desired at the object plane to detect a given aberration such as Z35 (FIG. 28A). The darkened areas indicate that the real targets are spatially-limited and the square wave indicates the approximation of the ideal field desired at the object plane with a mask having binary transmission with 0° (positive or yellow) and 180° (negative or red) phase shift.
Figure 33:
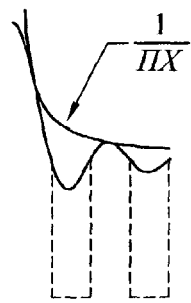
FIG. 33 illustrates modulation of the sine-function by a hyperbola, indicating that the outer portion of the aberration targets is significantly overdriven by the square wave implementation. The darkened areas indicate that the real targets are spatially-limited and the square wave shows the approximation of the idea field desired at the object plane with a mask having binary transmission with 0° and 180° phase shift.

Further investigation of the targets is also required to determine the effect of the fact that the square wave implementation significantly overdrives the outer portions of the target, as seen in FIGS. 32 and 33.

It was shown above that the optimum target in the object plane for a given one-dimensional aberration is the convolution of the Fourier transform of the product of an aberration function (sin or cos) times a finite support function (rect). Analogously, in two dimensions, the optimum target for a single Zernike aberration is the two-dimensional Fourier transform (2DFT) of the product of a Zernike polynomial times the supporting circ-function. The result is the convolution of the 2DFT of a Zernike polynomial with the Fourier transform of the circ-function—a Bessel function of the first kind, order one, which gives the Airy pattern when squared. The ideal target characteristics for one-dimensional aberrations yields great insight into the basic characteristics of optimum two-dimensional targets.

Before embarking considering the two-dimensional targets designed to detect Zernike aberrations, it is useful to establish the characteristics of the Zernike polynomials themselves. Following the convention set forth by Born and Wolf, each Zernike polynomial is represented by $Z_{n,m}$, where n is the order of radial variation of the aberration across the pupil and m is the order of azimuthal variation. Besides being orthonormal over the unit circle, each $Z_{n,m}$ has zero pupil-weighted area. This yields a zero on-axis in the Fourier transform of any Zernike term, giving a null on-axis and providing a natural location to position the sub-printable probe. The phase of the probe is determined by whether the Zernike aberration of interest (and thus its Fourier transform) is odd or even.

In the empirical development of the two-dimensional aberration targets their underlying nature was not fully understood. However, in this development it is revealed that, for a given Zernike aberration, the ideal target consists of a single "fat" ring concentric with an infinite number of thinner rings. The rings are a direct artifact of the Bessel function, which is analogous to the sinc-function in that it has a central peak that is wider than its sidelobes. The fat ring comes from this central peak and the thinner rings, which alternate in phase and decrease in magnitude with increasing radius, arise from the sidelobes of the Bessel function.

Figure 31A:
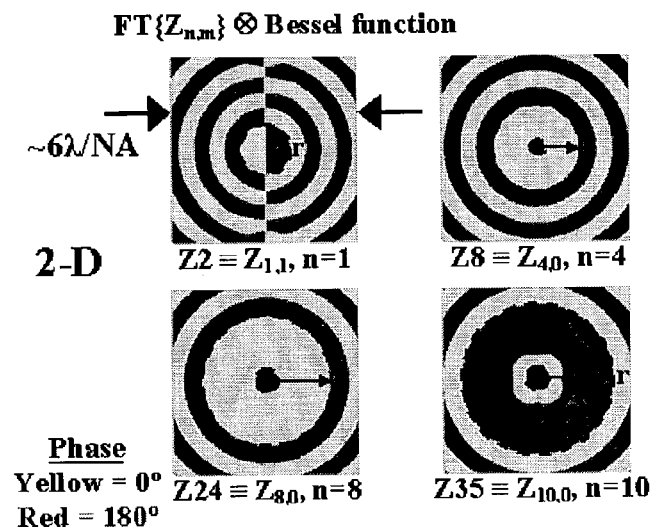
FIG. 31A illustrates aberrated PSFs for four different Zernike aberrations, showing the position, phase, and angular dependence of the target rings on the order of the radical (n) and angular (m) variation of the aberration itself.

To illustrate this, a MATLAB script was used to calculate the aberrated PSFs of an imaging system for given Zernike aberrations. The results for a few of the lower-order Zernike terms are shown in FIG. 31A. The electric field with a 0° phase is represented as lighter and the electric field with 180° phase shift is darker. From the figure, it is seen that the predictions made about the optimum two-dimensional targets were accurate. It can also be seen that the Fourier transform of a Zernike polynomial is a two-dimensional (cylindrical) δ-function with its characteristic radius, R, dependant on the number of zero crossings, n, of the aberration function in the pupil.

Figure 31B:
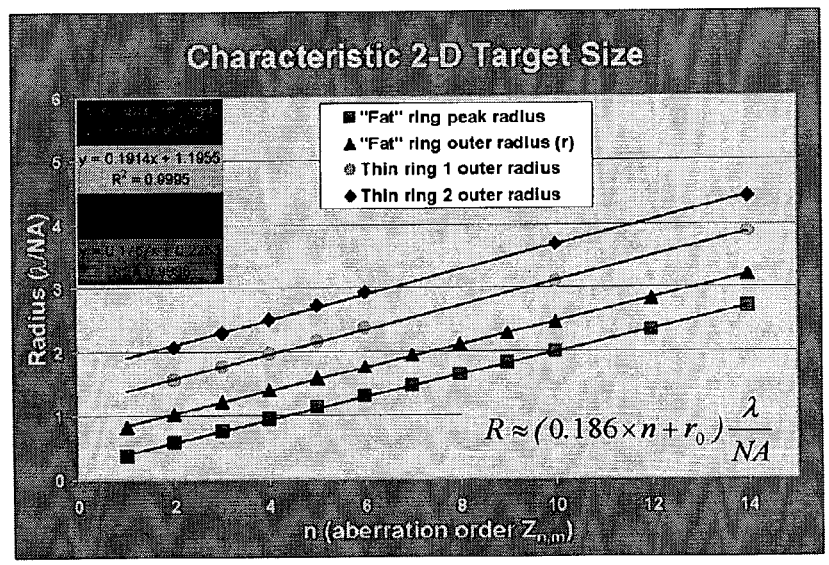
FIG. 31B illustrates dependence of characteristic target radius as a function of n.

Further similarity to the one-dimensional case is established by taking cut lines of electric field through the centers of the various two-dimensional aberrated PSFs. This yields plots similar to that seen in FIG. 29B. Following the results of the one-dimensional case presented in Section III, a linear relationship is expected between n and the radius at which the fat ring in the target occurs. FIG. 31B shows a plot of the characteristic target size as a function of n. Plotting the positions of many of the ring edges and taking the average of their slopes it is found that the relationship $$R \approx (0.186 \times n + r_0) \frac{\lambda}{NA}$$

where $r_0$ is the position of a given ring in the Airy pattern. Again, the intuition gained from the one-dimensional case has proven to be directly applicable to the two-dimensional case.

The electric field scattered from a given Zernike target, is taken to be $$E_{\text{Diff\_T},n,m}(\rho, \theta) \approx \sum_{n=1}^{\infty} \sum_{m=0}^{n} D_{T,n,m} Z_{n,m}(\rho, \theta),$$

where ρ and θ are again the pupil coordinates, and $D_{T,n,m}$ is the complex amplitude of the n, m order of the Zernike expansion of the fields scattered by the target surrounding the probe and incident upon the pupil. This, however, only accounts for one of the possible effects of the target. It is of interest therefore to extend and generalize the treatment of aberration detectors to include both amplitude and phase error effects in the diffracted electric field. By analyzing the non-zero terms in the diffraction integral, it can be determined which factors are important in optimum target design.

In general, the electric field diffracted from the aberration target and incident upon the lens is given by $$E_{\text{Diff\_T},n,m} = A(\rho,\theta) e^{jk\psi(\rho,\theta)}$$

where $A(\rho,\theta)$ is an amplitude transfer function and $e^{jk\psi(\rho,\theta)}$ is the phase term. This accounts for amplitude modulation of certain frequencies of the diffracted light. In addition to expanding the amplitude of the scattered light, the phase can also be expanded as a series of Zernikes. $\psi(\rho,\theta)$ over the pupil then becomes $$\psi(\rho, \theta) = \sum_{n=1}^{\infty} \sum_{m=0}^{n} B_{n,m} Z_{n,m}(\rho, \theta).$$

Assuming small deviations in the phase of the illuminating wavefront, the Taylor expansion approximation $$e^{jk\psi(\rho,\theta)} \approx 1 + jk\psi(\rho,\theta)$$

is valid. It is assumed that the amplitude transmission is only slightly perturbed from unity and therefore $$A(\rho, \theta) = 1 + \sum_{n=1}^{\infty} \sum_{m=0}^{n} C_{n,m} Z_{n,m}(\rho, \theta).$$

Substituting the above expressions into the diffraction integral presented in Section III and looking at the central probe position in the image plane (x',y')=(0,0), a ten-term integral is attained.

$$E_{\text{Image}\_\pi}(0, 0) \approx \frac{1}{\pi} \int_0^{2\pi} \int_0^1 (E_{\text{Ideal\_P}} + E_{\text{Diff\_T},n,m} e^{j\phi T_{n,m}}) e^{jk\Phi(\rho,0)} \rho d\rho d\theta$$

$$E_{\text{Image}\_\pi}(0, 0) \approx$$

$$\frac{1}{\pi} \int_0^{2\pi} \int_0^1 (E_{\text{Ideal\_P}} + A(\rho, \theta) e^{jk\psi(\rho,\theta)} e^{j\phi T,n,m}) e^{jk\Phi(\rho,0)} \rho d\rho d\theta$$

$$E_{\text{Image}\_\pi}(0, 0) \approx \frac{1}{\pi} \int_0^{2\pi} \int_0^1 \left[ E_{\text{Ideal\_P}} + \left(1 + \sum_{n=1}^{\infty} \sum_{m=0}^{n} C_{n,m} Z_{n,m}(\rho, \theta)\right) \times \right.$$

$$\left(1 + jk \sum_{n=1}^{\infty} \sum_{m=0}^{n} B_{n,m} Z_{n,m}(\rho, \theta)\right) e^{j\phi T_{n,m}} \left[ e^{j\phi T_{n,m}} \right] \times \left[1 + \right.$$

$$\left. jk \sum_{n=1}^{\infty} \sum_{m=0}^{n} A_{n,m} Z_{n,m}(\rho, \theta) \right] \rho d\rho d\theta$$

In the above, $E_{Ideal\_P}$ is the electric field at (0,0) due to the probe alone and $e^{j\Phi_{T,n,m}}$ represents probe phase required for optimum performance.

Invoking the orthonormality of the Zernike polynomials over the pupil and following, the diffraction integral is simplified. Using the property that the pupil-weighted area of any Zernike is zero, four of the terms are eliminated, leaving six non-zero terms. Ignoring the third order term which arises, the final form of the electric field arriving at origin of the image plane is given by $$E_{\text{Image}\_\pi}(0, 0) \approx$$

$$E_{\text{Ideal\_P}} + \left(1 - k^2 \frac{A_{n,m} B_{n,m}}{\pi(n+1)} + jk \frac{B_{n,m} C_{n,m}}{\pi(n+1)} + jk \frac{A_{n,m} C_{n,m}}{\pi(n+1)}\right) e^{j\phi T,n,m}.$$

There are two terms in this expression which depend upon the amount of aberration $Z_{n,m}$ in the lens, $A_{n,m}$. The first of these two terms, the $A_{n,m} B_{n,m}$ term, indicates that the electric field at (x',y')=(0,0) is affected by the interaction of the phase error from the target with the lens aberration. The second, the $A_{n,m}C_{n,m}$ term, shows that the interaction of the perturbation in the amplitude of the field transmitted by the target with the aberration can also affect the final field. The term containing the $B_{n,m}C_{n,m}$ product is a target self-interaction term, representing the interaction of the perturbation in the amplitude of the electric-field incident on the lens with the phase error, both of which are created by the target. This term must be small to prevent effects purely due to the target from overshadowing those terms that depend on $A_{n,m}$. Thus, optimum target design dictates that only one of $C_{n,m}$ or $B_{n,m}$ can be large and the other must be very small. If $B_{n,m} << C_{n,m}$ the target is an amplitude target and if $B_{n,m} >> C_{n,m}$ the target is a phase target. Because the $A_{n,m}B_{n,m}$ term affects the electric field by a factor of k more than the $A_{n,m}C_{n,m}$ term, it is preferable to use a phase target rather than an amplitude target to maximize the response to lens aberration.

Figure 34:
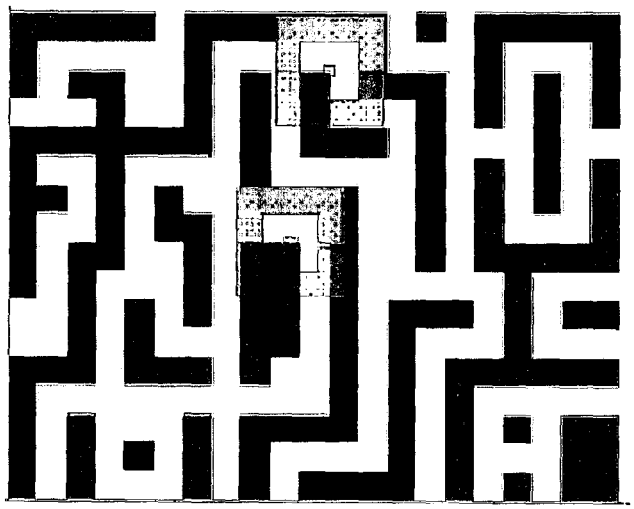
FIG. 34 illustrates two simple coma (sin) patterns matched to an example photo mask layout.

Consider now a prototype CAD system for rapidly determining locations in large layouts that are most impacted by aberration in projection printing, such as two coma (sin) patterns matched to an example photo mask layout as shown in FIG. 34. When aberrations are small, the exponential factor containing the optical path difference (OPD) in the integral over the lens pupil used to find the image can be linearized[4] as $e^{jOPD} \approx 1+jOPD$. This linerization into two terms can be physically interpreted as producing two additive electric fields at the image plane. The constant gives the electric field for an unaberrated image and the jOPD term gives a perturbation or spillover proportional to the strength and influenced by the azimuthal and radial characteristics of the OPD. For a Strehl ratio of 0.975, a two-term approximation is reasonable as the total RMS aberration is 0.025 waves, the peak OPD function values are about 0.05 waves, and a third term is at most only 10% as large as the first term.

The additive electric field of the jOPD term from a collection of mask openings in a neighborhood of a central observation point can be determined. One approach is to compute the contribution to the electric field from each of the surrounding pixels and then sum them up. A more interesting alternative is to first view the problem in the pupil of the lens and attempt to maximize the spillover from the jOPD term onto the unaberrated image term. In this view the additive field will be largest when the incident electric field is uniform in magnitude and exactly cancels the phase of the OPD. That is, the additive field in the pupil is proportional to $e^{-jOPD}=1-jOPD$. The inverse Fourier transform (IFT) of this function in the pupil can be used to determine the pattern on the mask that will create this maximized spillover onto the unaberrated image of the central pixel. The IFT of the constant term corresponds to a fixed and strength enhanced infinitesimal pinhole at the pattern center. The effect of this pinhole is independent of the level of aberrations and so it may be disregarded in studying the additive perturbation due to aberrations.

The IFT of the second term yields the desired composite pattern centered at the central observation point on the mask that will produce the greatest spillover onto the observation point for the given set of aberrations making up the OPD. This pattern is zero at the observation point itself due to the fact that the Zernike functions other than the zeroth that are included in aberration measurements individually have zero area when integrated over the pupil. The zeroth order term can be viewed as producing the unaberrated image complete with proximity effects. The contribution of the IFT test pattern at the wafer of an additive aberration induced electric field $E_A$ at the central observation point can be calibrated as follows. First compute the IFT for a given jOPD and digitize it into a pattern surrounding the central observation point. Then simulate the aerial image of this pattern in the presence of the aberrations and take the square root to convert intensity at the central observation peak to electric field. Here $E_A$ is a complex quantity and its imaginary part comes from even aberrations (such as defocus, spherical, and astigmatism) while its real part comes from imaginary aberrations (such as coma and trifoil). Simulating the image of this pattern under the illumination conditions utilized in printing the wafer is believed to also help account for the reduction in sensitivity with partial coherence. The theory above implicitly assumes coherent illumination rather than the partial coherence used in various illumination schemes in projection printing.

Once the perturbation of the complex electric field at the observation point due to aberrations $E_A$ has been found, the impact on the image can be evaluated. A very important consideration is the phase of $E_A$ relative to that of the electric field in the image of the unaberrated feature. This can be assumed to be the phase of the feature on which the observation point is located. The component $E_{AO}$ orthogonal to the feature (usually due to even aberrations) simply produces an additive intensity effect $\Delta I_O = |E_{AO}|^2$. The component $E_{AC}$ co-linear with the feature (usually due to odd aberrations) creates a composite intensity that is the square of the sum, including sign, of the electric fields. The composite intensity is $I_C = I_F + 2\mu_{FA}\sqrt{I_F}E_{AC} + |E_{AC}|^2$. Here $I_F$ is the feature intensity at the observation point. For example, at the edge of a line, $I_F$ is 0.3 of the clear field and the unaberrated electric field is $\sqrt{I_F} = E_F = 0.55$. The parameter $\mu_{FA}$ is the mutual coherence between $E_F$ and $E_{AC}$ and is negative when $E_{AC}$ and $E_F$ are in opposite directions. The total intensity perturbation is thus $\Delta I = |E_{AO}|^2 + 2\mu_{FA}\sqrt{I_F}E_{AC} + |E_{AC}|^2$. The resulting linewidth change $\Delta L$ can be found by dividing $\Delta I$ by the intensity slope at the feature edge[5].

The first prototype of the pattern matching system was written entirely in version 97A of Cadence Design Framework II's interpreted SKILL programming language, which is similar to both C and LISP. The built-in SKILL hash tables and other data structures are very easy to use, but SKILL does not permit the low-level data types and bit operations required for efficient pattern matching operations. Also, SKILL uses a garbage collection method to deal with memory allocation and freeing, while a more explicit memory management system was needed for the memory intensive matrix-based algorithms. A single matching run took several minutes and up to 100 MB of memory, and the use of large hash tables of complex objects led to problems in Cadence. Since the Cadence SKILL pattern matcher was not as fast at expected and did not support low level operations, the core matching, polygon processing, and extraction code was written into a separate C++ binary. Cadence continues to control software flow, provide a GUI, and convert to/from CIF, GDS, or other layout formats. In addition, Cadence is used to flatten hierarchy, perform geometric transforms, determine overlap, and merge shapes on various layers because of its efficient internal implementations of complex geometric operations.

Figure 35:
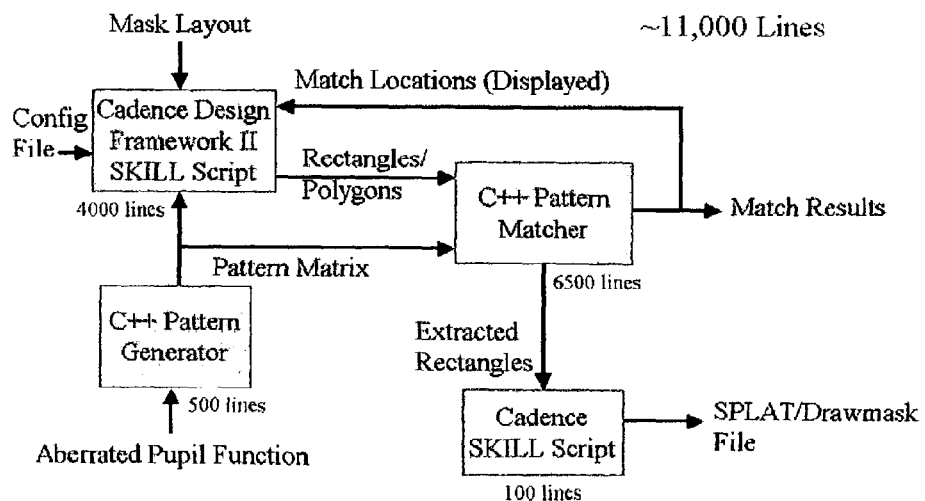
FIG. 35 is a block diagram of data flow through an entire pattern matching system.

This software package consists of four main components, shown in the block diagram of FIG. 35: the GUI and I/O code, pattern generator, core pattern matcher, and SPLAT extractor. The GUI and extractor code were written in the SKILL language of Cadence's DFII and are configurable to meet the needs of individual systems and designers. The SKILL scripts read a mask layout file, set of pattern files, and configuration file from disk. The mask layout can be a CIF file, GDS file, Cadence DFII cellview, or any other supported format. The configuration file specifies the patterns to use, physical/optical parameters, matching types, and a variety of other options. Each pattern file can be either written by hand or generated by providing a set of Zernike polynomials to the pattern generator binary.

Cadence flattens and merges the layout and creates a large intermediate file consisting of rectangles, polygons, patterns, and parameters required for the matching algorithm. Then Cadence executes the core pattern matcher, which reads the intermediate file, runs the matching algorithm, and produces two results files. The first results file contains the ordered locations, scores, types, and layer IDs for the highest scoring matches of each pattern. This is read by another SKILL script and the results are displayed graphically in the layout window. The other results file contains extracted rectangles that are converted into SPLAT file format by the final SKILL script.

The process begins with a possibly hierarchical 0/180 phase-shift mask layout in a standard format such as CIF or GDS. The Cadence Design Framework II is used to stream in the layout, flatten the hierarchy, and merge the overlapping shapes into non-overlapping shapes. The flattened and merged Cadence mask layout consists of many rectangles, polygons, and paths on a set of drawing layers. All paths are converted to polygons inside of Cadence and all polygons are then converted to rectangles in either Cadence or the pattern matcher binary. Since the binary is separate from Cadence, every rectangle and polygon must be written to an intermediate I/O file along with the patterns and other information. Rectangles consist of a set of integers representing x1, y1, x2, y2, and the layer ID. Polygons consist of the number of points, a list of points as integer pairs, and a layer ID. The drawing layers typically consist of 0-, 180-, and sometimes 90-degree phase areas, in addition to an unlimited number of temporary Boolean layers. The Boolean layers serve several purposes, including limiting matching areas and enhancing visualization of the layout. Extra layers increase the size of the intermediate files, but do not have a significant effect on the runtime or memory requirements of the core matcher.

Figure 36:
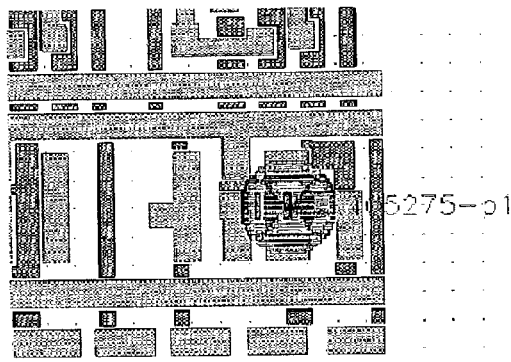
FIG. 36 is a pattern matcher matching the astigmatism pattern to the best location on a 0/180 PSM layout.
Figure 37:
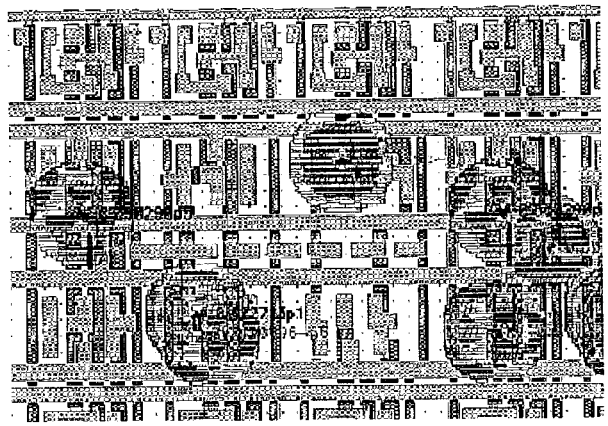
FIG. 37 illustrates matching runs involving many different patterns, including a single run showing the best matched such as trifoil, spherical, and astigmatism on a 0/180 PSM.

Once the pattern-matching phase is complete, the results are written to a file and read in by Cadence for graphical display purposes. The specified number and type of patterns are drawn at the locations with the highest correlation between the pattern and underlying layout geometry. Each pattern is shown as a bitmap color coded for phase along with a text string specifying match type, normalized score value, pattern ID, and underlying layer phase. Pattern requirement locations and optionally extracted Boolean layers are shown in different colors. FIG. 36 shows the results of a sample run with the astigmatism pattern, while FIG. 37 demonstrates that the pattern matcher can process many matches of several different patterns in a single run.

Figure 38:
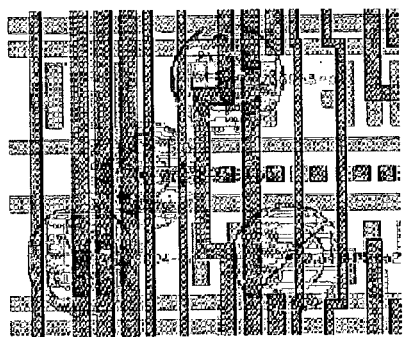
FIG. 38 illustrates examples of patterns for simultaneous aberrations of coma (cos)+random, coma (sin)+coma (cos), and spherical+defocus, demonstrating that arbitrary patterns can be constructed from Zernike polynomials.

A separate pattern generator binary was written in C++ to create 2D pattern matrices from sets of Zernike polynomials. This code incorporates a publicly available two-dimensional FFT/IFFT package to compute the inverse Fourier transform of each pupil function. The pattern generator first reads a set of weighted aberrated pupil functions, each in the form of a list of coefficients representing powers of rho, sin and cosine coefficients, and coefficients for phi in both the sin and cosine terms. Any combination of common aberrations or arbitrary Zernike polynomials can be converted into a pattern matrix. Refer to FIG. 38 for an example of a matching run involving several simultaneous aberrations.

A large background matrix of zeros is constructed around the pupil function to provide isolation for the IFFT. The 2D IFFT of each function is taken, and the results are summed into a final matrix and written to file. The pixel size of the pupil function, the background matrix, and the resulting power of two pattern are specified in the input file. Pattern sizes of 32×32, 64×64, and 128×128 pixels provide both adequate accuracy and reasonable matching times. Several other SKILL scripts are used to resize, re-center, and trim the pattern matrices before the core pattern matcher binary uses them.

Figure 39:
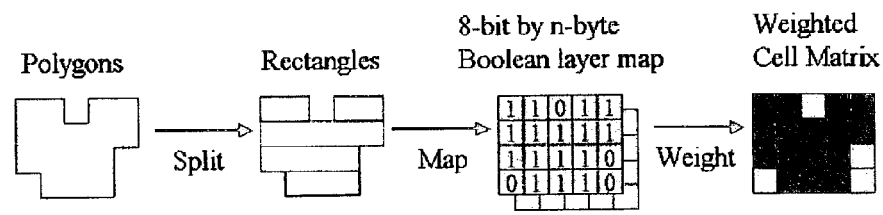
FIG. 39 illustrates data structures of a core matching procedure where polygons are read from file, split into rectangles, added to an array of Boolean layers.

The pattern matcher binary, written in C++, is a standalone, platform-independent, compiled executable that reads and writes a variety of files to disk. This binary is intended to be called from inside Cadence, but can be run independently if the input files are present. Depending on the verbose level specified in the command line, various warning, error, progress, and statistics messages are sent to stdout. The strict input parser and extensive internal error checking will cause the binary to quit on any error and return one of a number of error codes recognized by the Cadence SKILL script. A flowchart showing the construction of several major data structures is shown in FIG. 39. The main algorithms that create and process these data structures are outlined in the section below.

The input file consists of rectangles and polygons on a Manhattan grid. Since polygons are more difficult to partition, sort, and store than rectangles, each polygon is split into a number of rectangles as it is read from disk. However, before the polygon is split its edges, inside corners, and outside corners are added to their respective data structures. The splitting algorithm proceeds by scanning through the points and locating the set of unique x and y values or divisions that, if used as cutlines, will partition the polygon into a large but nearly optimal number of small rectangles. Next, a binary edge matrix is built, where a value of '1' represents the presence of a vertical edge along that cutline segment. An in-poly binary flag is initialized to 0 and toggles each time a 1 is encountered in the edge matrix. Each x value of each row of the edge matrix is iterated through, and horizontal rectangles are extracted from the polygon for each consecutive y value. The starting x value of the rectangle results from the location where the in-poly flag toggles from a 0 to a 1, and the ending x value results from a 1 to 0 toggle in the same row. Each rectangle is stored in a vector and added to the layer map in a later step.

Edges, line ends, and corners are either extracted by the Cadence script and included in the intermediate file, or extracted from the polygons in the input file by the pattern matcher binary in the following manner. Each polygon side is added to the set of edges, the set of line ends, or both, depending on the length of the side and other input parameters. A clockwise polygon traversal is assumed, and separate sets of inside and outside corners are built based on the directions of polygon side vectors. Since a polygon must have four more outside corners than inside corners, the corner sets are swapped if their sizes are incorrect. This case results when the polygon points were actually specified in a counterclockwise direction.

Replacing the standard 2D floating-point matrices with single dimension integer arrays reduces file size and memory requirements by substituting two floating-point coordinates with a single integer. The unique coordinate is constructed by adding the x_value and x_size*y_value. Dividing the layout and corresponding matrices into partitions further reduces memory requirements since only a single partition of the layer map and cell matrix are constructed in memory at any given time. The rectangles and edges are also partitioned into sets prior to creating the matrix partitions so that the geometry related to a partition can be processed independently of the other partitions. This could allow the matching process to be run on many processors simultaneously with or without shared memory, although this feature has not yet been implemented.

Each partition of the layer map is converted into the 2D cell matrix prior to calculating the match values at each location. The weights for each of the up to 256 possible combinations of overlapping layers in each set of 8 layers (each byte in the layer map) are pre-calculated. All bytes and all pixels in the layer map are iterated through, and the byte at each location is used to reference a weight from the previously calculated table, which is added to the corresponding pixel in the cell matrix. This leads to a cell matrix of floating point pixel values equal to the sum of the weights of every layer present at that pixel. The match value of a pattern at a specific location is the sum of the products of each pixel in the pattern with the matching pixel at the match location in the cell matrix. The calculation of match values takes up to 90% of the matcher's runtime.

The core matching binary is capable of processing an arbitrary number of mask layers and temporary layers. Since the layer map is stored as a character based bit vector, eight layers can be processed in a single operation. The matcher is capable of evaluating a set of equations describing Boolean operations to be performed on the layers. These operations include layer AND, OR, XOR, NOT, 2D derivative, and algebraic combinations of these. Patterns can be constrained to only match certain real or temporary layers, such as where poly overlaps active region, forming a transistor gate. Any of these layers can be extracted into rectangle format and imported back into Cadence as a form of external layer Boolean. In some cases this process is faster than the internal Cadence layer Booleans because of the parallel nature of the layer processing operations.

The single most important factor in the speed of this code is matrix compression. In many cases, both the mask layout and the pattern matrix can be compressed by averaging a block of 2×2 pixels into a single pixel. This 4× pixel compression reduces all dimensions by a factor of 2 and matrix size by a factor of 4. Since the innermost loops iterate through both the mask matrix elements and the pattern matrix elements, a compressed match takes 4×4 or 16 times less matrix element multiplies. Furthermore, the compression can be repeated recursively for higher compression levels of 16:1, 64:1, . . . , until the pattern becomes too small to compress further. The maximum number of compression levels is usually limited to three by compression overhead and error. As in any form of lossy compression, accumulated error can eventually lead to incorrect results. Once the best matches are found, the matching algorithm is run on the higher resolution, uncompressed matrices to determine the exact match value, and only the top few of these are kept. A complex set of equations is used to dynamically calculate the worst-case error for each pattern and adjust the number of "best" matches to be preserved for the high resolution filtering. At first, this error compensation procedure led to an increase in runtime because the worst-case error resulted in most matches run at both low-resolution and high-resolution mode. Since the worst-case error was an order of magnitude higher than the average error, probability theory was used to estimate the maximum expected error and produce a cutoff ratio for defining the "best" matches based on the distribution of scores. The compression algorithm has been further refined several times to produce a version with user parameters to adjust the tradeoff between speed and accuracy.

It is difficult to verify the correctness of the algorithm with such complex input file syntax, dozens of available options, and several compression parameters. After many failed attempts at testing the correctness of the code, the use of geometric transforms on both the mask and the target finally provided an easy way to locate several major bugs. In this process, the results of a simple matching run were first recorded. Then both the layout and the pattern were transformed through identical rotations, translations, mirroring, and scaling and rerun while the results were again recorded. Since the pattern and layout underwent the same transformations, the results should have also been the same regardless of the transform used. Cases of observed deviation in results were investigated with smaller or isolated designs until the bug was found. In addition, matching runs were performed with various combinations of options and debugged until they produced identical results.

SPLAT is an aerial image simulator that produces image intensity plots along cutlines and contour plots of intensity over pattern areas from an input file representing a portion of a mask layout (K. H. Toh and A. R. Neureuther, Proc. SPIE vol. 772, pp. 202, 1987). The SPLAT file format consists of a header defining variables such as sigma, lambda, NA, and simulation area followed by a list of rectangles and finally plot commands. The SKILL extractor and SPLAT file converter can only produce rectangles with transmittance of 1.0 and phase of 0, 90, or 180 degrees, which is sufficient for most standard PSM layouts.

Three rectangle extraction algorithms have been written, each having a different speed vs. quality tradeoff. The original extractor, which is still used in the polygon splitting algorithm, locates rectangle edges and extracts horizontal slices from left to right between pairs of edges in a form of one dimensional rectangle expansion. This algorithm is less efficient than the others, but is required when dealing with the overlapping or self-intersecting polygons that may appear in the input file. The next algorithm involves searching for the bottom left corner of a rectangle and expanding up and to the right while removing the rectangle from the bitmap matrix. Only a single bit is used to represent each pixel. This is very efficient, possibly talking less time than actually creating the bitmap, but the set of extracted rectangles is not always minimum. The final extraction algorithm expands in all four directions, decrementing a pixel counter for each pixel in the extracted rectangle. After one pass, the previously described two-dimensional extractor is called to extract the remaining rectangles. This extractor is believed to produce the exact minimum number of rectangles, but the extraction takes at least twice as long and several times the memory (for the counters) as the two-dimensional extractor. Also, this four-way expansion algorithm can produce overlapping rectangles, which are not supported in SPLAT. Thus, the original two-dimensional extractor was chosen to convert the layout bitmaps into rectangles.

The extraction and SPLAT simulation procedure is shown in FIGS. 40–43. FIG. 40 is a close-up of a coma pattern above the layout geometry to be extracted. After rectangle extraction, the output file is converted to the SPLAT format through the use of a SKILL script. The drawmask plot of this SPLAT file, which matches the geometry in the original layout, is shown in FIG. 41. FIGS. 42 and 43 are contour plots of SPLAT simulations with and without 0.1 waves of coma. Notice how coma makes the printed line in the center of the contour plot narrower (contour lines closer together) and shifted to the left.

FIG. 44 illustrates a handcrafted layout of test structures designed to be sensitive to the trifoil, coma, and spherical aberrations. This layout consists of arrays of targets of varied dimensions that are common in real layouts and likely to have a high degree of similarity with the test patterns for the aberrations indicated. This layout was used to initially test the matching theory as well as the software. The normalized pattern-matching factor for these shapes ranged from 0.362 for coma, 0.419 for trifoil and 0.470 for spherical.

major algorithm was individually timed and profiled, optimized, and recompiled dozens of times. Some of the algorithms were changed several times to increase speed and reduce memory requirements. The combination of partitioning, prefiltering, compression, and conditional code execution led to a very efficient implementation of the matcher. Typical performance values recorded before the final profile-based optimizations are shown in Table 1. One level of compression was used with each of the test runs listed in Table 4. As shown in the table, all test design runs completed in only seconds and required only a few tens of MB of memory, even designs as large as 87 M pixels.

TABLE 4

Typical speed and memory performance for the pattern matching software on a 0.35 um technology node FPGA interconnect custom layout.

Performance on generated PSM, fastest options, 16 MB partition size on 440 MHz HP System

| Layout Size (um) | Resolution (um) | Matrix Size (×1E6) | Partitions | Pattern Size | Patterns | Time (s) | Memory (MB) |
|---|---|---|---|---|---|---|---|
| 152.1 × 179.9 | 0.1 | 2.7 | 2 | 64 × 64 | 8 | 6.51 | 30.6 |
| 149.7 × 175.9 | 0.1 | 2.6 | 2 | 32 × 32 | 8 | 39.79 | 54.2 |
| 149.7 × 175.9 | 0.1 | 2.6 | 2 | 32 × 32 | 3 | 6.54 | 13.5 |
| 149.7 × 175.9 | 0.1 | 2.6 | 2 | 44 × 44 | 1 | 0.95 | 18.8 |
| 149.7 × 175.9 | 0.05 | 10.4 | 8 | 44 × 44 | 1 | 2.11 | 23.1 |
| 887.1 × 977.3 | 0.1 | 86.7 | 60 | 44 × 44 | 1 | 22.76 | 47.3 |

Figure 45:
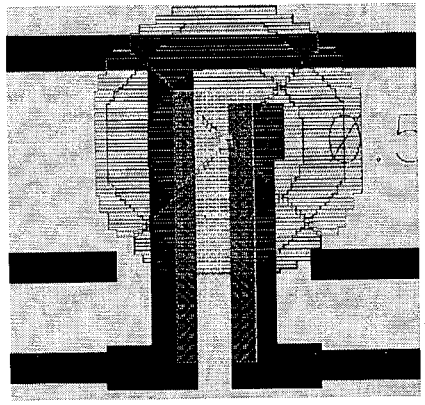
FIG. 45 illustrates a mask tested for astigmatism (cos) aberration in a dark field.
Figure 46:
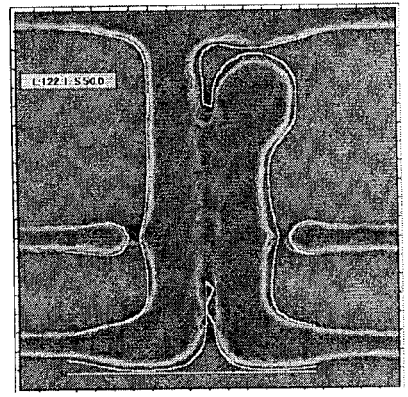
FIG. 46 is a clear field print of a mask similar to FIG. 42.

FIGS. 45 and 46 show a small piece of a clear field binary mask layout and a print of a similar layout at 193 nm. The challenge for the lithographer is to be able to read the resist image on the wafer and distinguish issues associated with diffraction limited imaging of simple features, optical proximity, aberrations, and resist performance. The most difficult feature to control in this layout is the small gap between the vertical resist lines. The diffraction limited imaging of the narrow opening on the mask is likely a rather nonlinear function of the opening width. The local roughness observed in this gap in the print occurs over a distance much smaller than the resolution and is clearly an indication that the resist performance is also an issue. The optical proximity effects are clearly evident in that the large vertical lines bulge toward the small horizontal lines. The pattern matching software allows the potential effects of aberrations to be tested. The most sensitive edge location within the center rectangle is the 0.51 match value for astigmatism (cos) as shown in FIG. 45.

Figure 47:
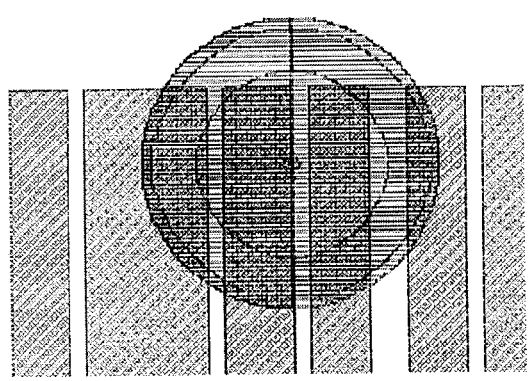
FIG. 47 illustrates using the mask edge regions with the highest light intensity are found to be at the inside corners when using the unaberrated pupil function as a pattern.
Figure 48:
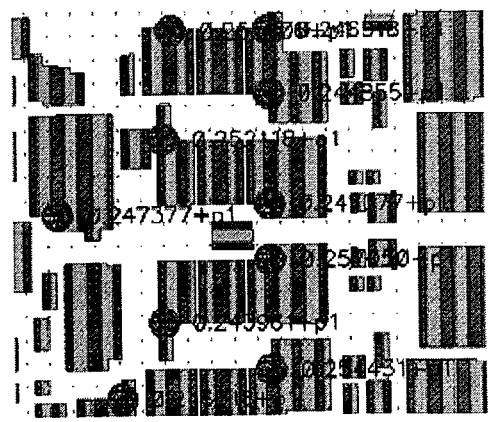
FIG. 48 illustrates one result of matching the coma pattern to a real 0/180 PSM design; this coma pattern has a slightly larger radius than the partial third ring.

Pieces of a set of 0/180 industry PSM layouts are shown in FIGS. 47 and 48. Not only does the pattern matcher locate areas in the mask layout susceptible to aberration effects, but FIG. 47 demonstrates that it can also locate the points along the edge of the mask regions with the highest light intensity using the IFFT of the unaberrated pupil function. All locations marked in FIG. 47 are inside corners, even the small notches in the vertical strips that cannot easily be seen in the picture. The match scores and other identifying text symbols are displayed next to their respective matched patterns. Other aberrations were run over this same layout with patterns such as the coma target shown in FIG. 48. Notice how the coma pattern closely resembles the mask layout underneath it.

The pattern matching software package, especially the core matching binary, was designed for the fastest possible matching runs using as little memory as possible. Each Other experimental results showed that a single level of compression reduces the runtime by a factor of two to four, two levels of compression by a factor of up to seven, and three levels of compression by a factor of up to ten. Further levels of compression do not provide a significant speedup due to compression overhead. One level of compression rarely results in missed matches, while more than one level of compression can result in errors if the compression adjustment and correlation factors are set incorrectly.

This code can find the effects of residual aberrations in less time than it takes Cadence DFII to flatten the layout for a typical layer in a chip and a full set of 36 Zernike coefficients. We have estimated that a typical 1 cm square chip can be processed with adequate physical accuracy in about an hour if sufficient memory is available. Partitioning reduces the memory required to represent the layer map and cell matrix, allowing a standard workstation to be used. A typical 16 MB partition contains about 1.3 million matrix elements, or 1.3 M pixels, which is promptly freed after it's used in the matching loop. In most cases, single level compression can lead to a significant speedup, while multi-level compression can have even more dramatic results if care is taken to provide the proper parameters. Matching time scales with resolution for line ends and edges, scales with resolution squared for unrestrained areas, and is independent of resolution for corners represented by single points.

Figure 49:
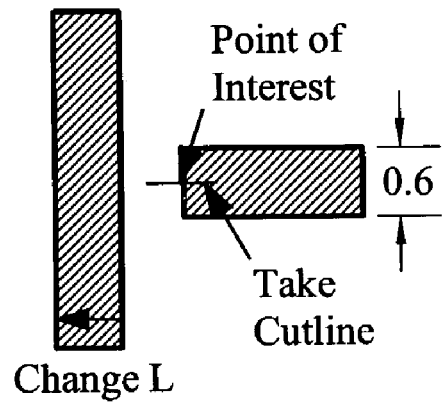
FIG. 49 is a layout of a horizontal line and a vertical line used to compare the effect of lens aberrations.

The binary layout involved in testing the effects of aberrations and OPC consists of a minimum feature (0.6 $\lambda$/NA) sized horizontal line and a neighboring vertical line of varying width, as shown in FIG. 49. The point of interest was chosen to be the left end of the horizontal line, with the cutline running from left to right. In order to observe the magnitude of line-end shift due to OPC, simulations were run with the left edge of the vertical line at various positions leading to a line width (L) of up to 1.2 $\lambda$/NA and compared to the simulation results of an isolated horizontal line (L=0). The effect of aberrations was determined by adding 0.025 waves of RMS aberration to the simulation for each value of L and reporting the line end position shift due to each of the four aberrations.

Figure 50:
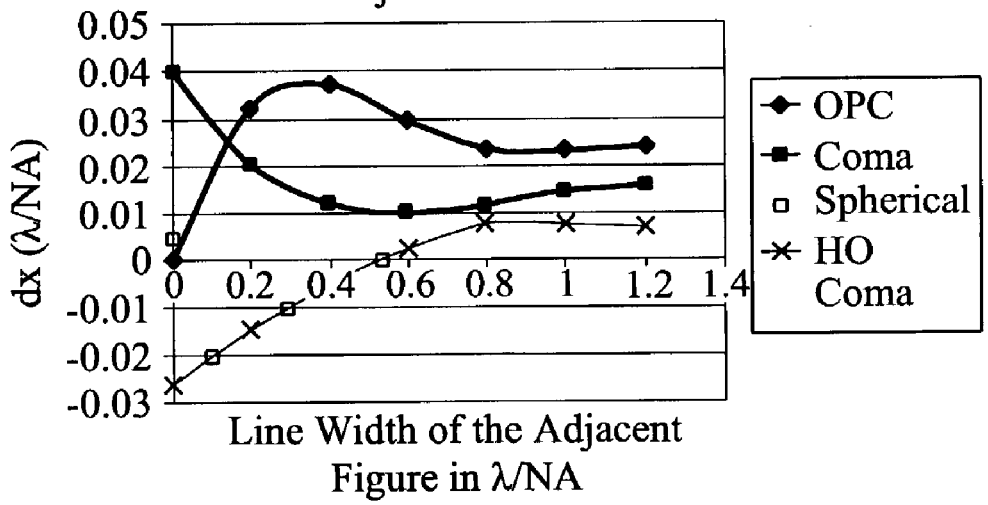
FIG. 50 is a plot of line end position as a function of width on an adjacent vertical line.

A plot of line-end shift of the horizontal line vs. change in width of the vertical line as a result of both optical proximity and aberration effects is given in FIG. 50. The curves are highly variable in the sub-printable linewidth region (less than 0.6 λ/NA), but as the line widens the curves approach a constant value. The line shift caused by coma (cos), the aberration that this layout geometry is most sensitive to, is about 0.015 λ/NA, which is over half the line shift caused by optical proximity of the vertical line to the line end of interest. This illustrates that the effect of aberrations in a good lens is about half that of adding an adjacent shape in close proximity to the line end of interest (OPC). The effects of aberrations should thus be taken into account during mask layout design. If the aberrations present in a given exposure tool or family of exposure tools are known, then this information could be used to counteract the effect of the aberrations in sensitive areas of the mask geometry.

Figure 51:
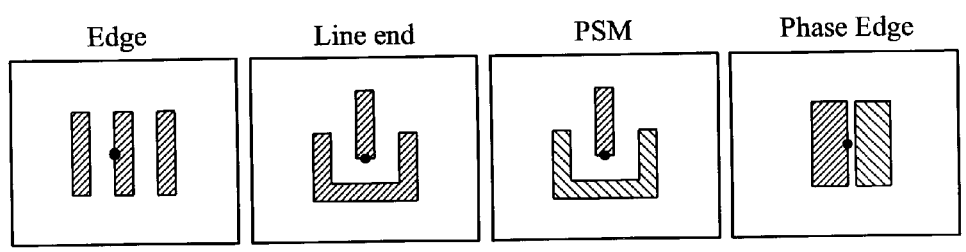
FIG. 51 illustrates test layouts used in pattern matching and simulation.

In order to test the ability and limitations of the pattern matcher in predicting the intensity increase due to various aberrations, we initially conducted a "kitchen sink" screening experiment. That is, we identified areas with sizeable match factors, extracted the patterns, and computed the image change with SPLAT. We then used a diverse set of layouts (FIG. 51) to plot the magnitude of the intensity increase predicted by SPLAT versus the magnitude of the match factor. These layouts in FIG. 51 include simple line and space patterns, a line end with a surrounding feature with and without phase shifting, a phase-edge mask, and variations of the simple proximity effect mask in FIG. 49. This experiment included batch simulation runs of the four aberrations coma (cos), coma (sin), spherical, and high-order coma (cos).

Figure 52:
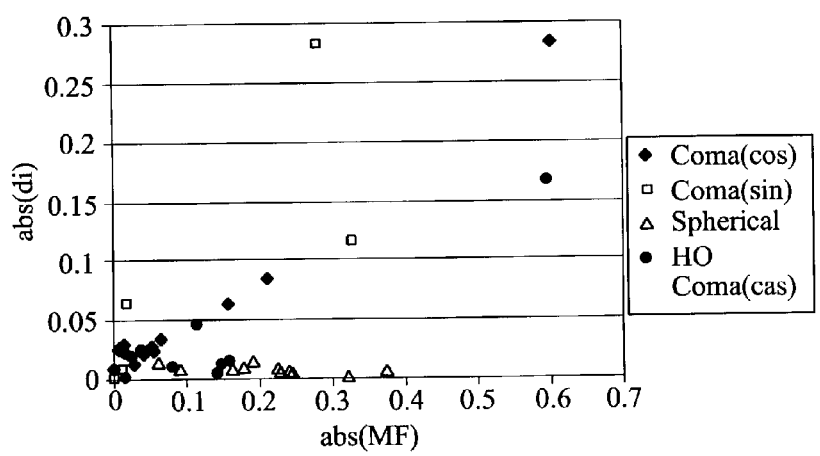
FIG. 52 is a plot of intensity change as a function of match factor for the layouts of FIG. 51.

The results for each of the four aberrations are shown in FIG. 52, which plots simulated intensity change as a function of match factor. The large variations in magnitude of the match factor and intensity change are due to the inclusion of various mask types and layout geometries into the results. It is notable that a number of the points for coma and high-order coma follow a straight line though the origin, thus allowing the change in intensity to be predicted from the match factor. The slope of this line depends slightly on the type of the odd aberration, and is on the order of 0.45, or a sensitivity of 0.19 per 0.01 λ/NA of aberration for the normalization used in the study. This suggests that the following equation can be used to very rapidly predict the line-end or line-edge shift without actually performing SPLAT simulations:

$$\Delta X = \frac{\Delta I}{\text{Slope}} = \frac{MF \cdot \text{Sensitivity} \cdot \frac{\text{Aberr\_level}}{0.01\lambda/NA}}{\text{Slope}}$$

Where MF is the match factor normalized to lie in the range [−1.0, 1.0], Sensitivity is an aberration dependent parameter typically around 0.15 to 0.3, and Aberr_level is the RMS value of added aberration in λ/NA.

It is also apparent from FIG. 52 that the points for spherical aberration, which is an even aberration, follow a completely different behavior. The intensity change is much smaller. This is expected for even aberrations because the electric fields add in quadrature and do not significantly increase the length of the electric field vector. In theory, the intensity change is expected to be at a much smaller level and should only increase as the square of the aberration contribution.

In summary, the purpose of the pattern-matcher layout assessment software system is to allow large multiple mask layouts such as IC chip designs to be searched rapidly to identify, quantitatively assess, and help arbitrate worst-case impacts of residual physical process effects from surrounding layout regions. The importance of indirect consequences of less than ideal fabrication processes is a growing concern. The level of residual processing issues in illumination, masks, lenses, resists, defects and wafer topography is growing rapidly with low k1 lithography and low k-factor dielectrics. While no one domain of technical expertise is particularly at fault, it is not clear if these problems should be addressed in design or in process or even how to coordinate a discussion of these problems. Issues often become over-managed with over-specification to keep them at arm's length. An unintended but inherent consequence of not being able to sort through the real issues is that the over-specification greatly increases costs of manufacturing.

The pattern-matcher layout assessment software system offers a means of locating, quantifying and communicating between layout designers and process engineers prior to manufacturing. For example, the pattern-matcher layout assessment software system allows a form of 'no-fault assurance' when a process engineer needs to review an incoming layout for manufacturability on a specific set of fabrication equipment. The system also allows a form of 'fault versus delay and cost assessment' when a process engineer must decide whether to accept a photomask with a known and extensive set of defects at low cost and some yield reduction or to reject it and accept both additional mask costs and delay to market of the product. The multi-function processing of the pattern-matcher layout assessment software system also allows forms of 'defect tolerance assessment' and 'defect inspection location filtering' through combining characteristics of expected defects with the characteristics of the local image.

The common approach for assessing spillover of a residual physical process influence or attribute from a surrounding mask region onto an observation point is to use a lateral influence function to add up contributions from small sources that cover the mask region. This lateral influence function is known mathematically as the kernel function and the addition is a convolution of this kernel over the mask region. The attribute might be an intermediate property such as the electric field that is used to calculate a final property such as the projection printed image intensity at an observation point on the wafer. For accuracy, multiple kernels might be used, and for speed of evaluation the small sources might be factored into sets that could be pre-computed and reused in look-up tables. The optical proximity correction (OPC) software as described by Rieger in U.S. Pat. Nos. 6,081,658 and 6,289,449 teaches this method.

The pattern-matcher method is based on a mathematical approach that fundamentally differs from previous work. Instead of building up the lateral contribution of the physical influence from the surrounding region, a different problem, namely that of finding that pattern that maximizes the spillover from the surrounding pattern, is undertaken first. It is possible to find or at least intuitively approximate this maximal lateral impact test pattern for various physical spillover phenomena. For example, in the case of lens aberrations, the maximal lateral impact test function is the inverse Fourier transform of the optical path difference function. For thermal laser processing the relative temperature rise as a function of the underlying wafer topography can likely also be estimated theoretically. So too in predicting yield loss due to a standard normal distribution of misalignment between two layers. In this case the maximal lateral impact test function would be the area under the distribution or error function. For improved accuracy the local layout might first be corrected for imaging effects such as rounding of corners and bulging at defect locations. An intuitive estimate of the maximal lateral impact test function might be used for reflective notching where the change in surface height around a feature produces a lateral reflection. Here an annular ring of brightness proportional to the topography height change and of average radius a little larger than the topography height change might be used. An even simpler example of selecting a lateral impact test pattern is the use of a small region of a layout that proved problematic in the past.

Next, the quantitative effect of the spillover on an attribute or a final property is assessed for the maximal lateral impact test function by determining the change in the attribute and/or final factor with and without the presence of the residual process effect. In the example of residual aberrations, both the local intensity change and line edge shift are calculated by simulating the projection printed image in the presence and absence of the residual aberrations. The third step is to estimate the contribution of the spillover and change in attributes or final properties at an observation point surrounded by a given but arbitrary pattern layout. This is done by computing the similarity between the given layout and the maximal lateral impact test function, or the match factor. The value of the match factor is then used to estimate the severity by multiplying the match factor times the quantitative effect for the maximal lateral impact test function. For example, if the match factor were 0.5, the line edge shift due to residual aberrations would be half of the maximum line-edge shift.

The software implementation of the pattern-matcher system must address many challenges. First, the system must be capable of processing layouts that contain over one hundred million transistors and over a billion polygons. Second, this processing must be done on computers for which only a small fraction of this layout can be held in memory at once. Third, since the desired attributes and the residual processing effects are continuously varying, the set of potential observation points is theoretically infinite. Fourth, the accuracy with which the pattern-match is carried out for high match factors must be to about 1–2%. Fifth, it is imperative that information from more than one level of the layout be processed simultaneously. Sixth, nearly simultaneous computation of multiple attributes is often required. Seventh, lines at arbitrary angles, general circular shapes, overlapped shapes, and even typical printed feature shapes must be included.

The pattern-matcher software system addresses the above and other challenges as follows. The evaluation of the match factor is carried out on a bitmap formed from the set of shapes in a particular region of the input data. The bitmap is stored as a one-dimensional array and indexed by x and y integer values representing the input data on a minimum grid. It thus shares the computational speed and efficient use of memory found in computer graphics algorithms such as scan conversion. The method, while stimulated by concepts in computer graphics, also introduces key new concepts to treat the generality not found in computer graphics. These concepts result in a pattern matcher that can find and order the top N locations with highest match factors for a residual process effect through simultaneously processing multiple mask levels in a layout, with any scale of feature size between the maximal lateral test pattern, with complex valued contributions possibly from mask regions of different phase and with pre-filtering of potential locations according to user-specified location characteristic shapes using a large computational grid size for high accuracy with speedup resulting from selective local adaptive refinement in areas of dense mask geometry or high match factors and using the speedup of lateral interpolation of both match factors and their error bounds incorporating overlapped partitioning for memory limited computers or parallel processor systems.

A key element of the bitmap-based pattern matcher is a novel data structure that encodes groups of eight mask layers present at each pixel location into an intermediate array of eight-bit bit-vectors. In this manner it allows multiple mask levels to be encoded in a single pass. In addition, user-defined layers can be formed from the mask layers using Boolean operations, where the Boolean equations of layer groups are encoded into lookup tables representing various combinations of layers. In processing it is thus possible to simultaneously perform Boolean and other bit-level operations on up to eight layers. The combined weights of the layers present at each pixel are then added to the final weighted bitmap using a simple lookup into a 256-entry table representing all possible combinations of eight layers. This data structure thus enables novel features in the pattern matching system. For example, it enables the user to highlight a region with a real or special Boolean layer and ask for matches that occur only within that region even though the maximal impact test pattern may include computation from points extending outside the border of the selected region. It also enables the use of multiple test pattern functions and test pattern functions based on features on multiple masks such as is necessary in assessing defect printability and reflective notching respectively.

Another key element is that the match factor is computed in an adaptive manner using in effect an adaptive grid. This is accomplished by first compressing the patterns and bitmaps by averaging four adjacent pixels in a lossy manner to reduce the size of the grids. An approximation of the match factor is quickly computed on a low-resolution grid, and only the locations with high approximate match factors are checked in the original higher resolution grid. This grid compression-based adaptive refinement is implemented as a multi-level process where the matrices are compressed several times, and, starting at the lowest resolution, the estimated match factors are used to determine which areas are processed on the next higher resolution. Only a small fraction of the observation point locations that must be evaluated have large match factors that must be computed to an accuracy sufficient to determine the winners. Since computation can be carried out on a one step larger grid size four times faster, the number of low resolution points to actually consider is smaller, and the initial searching can be carried out at grid sizes several steps larger, this adaptive computational grid provides an order of magnitude speed-up.

Yet another key element is the speed-up of lateral interpolation of both the match factors and their upper bounds in an adaptive grid refinement algorithm. Similar algorithms are often used in computer graphics to determine dynamic lighting conditions and moving shadows on a mesh. The method developed here makes a significant extension to this concept in that x and y derivatives of the patterns are employed to estimate the upper-bound for the match factor at a new grid point based on the match factors at previously computed grid points. The derivatives for each pattern can be quickly computed in a preprocessing step based on the maximum difference between the match factors possible with the pattern positioned at position (0,0) and at position (x,y) with the underlying layout chosen to maximize this difference. Incorporating these two directional shifts into the inner processing loop allows match factors to be predicted using derivatives with fractionally small overhead.

A small additional speedup is achieved by terminating the match factor computation early if the partially computed match factor up to row i plus a pre-computed number representing the upper bound on the amount of contribution of the match factor from rows greater than i is less than the cutoff value.

Another key element is the speed-up based on pre-filtering of potential locations according to user specified location characteristic shapes. The user inputs the relative importance of geometries such as edges, line ends, and corners and, depending on the features chosen, the software extracts these features from the input rectangles and polygons. Instead of scanning over the layout and computing the match factor at each of the x_size by y_size locations, only points corresponding to those contained in the selected and extracted geometries are checked, which is only a small subset of the total set of points. False geometries, such as the overlapping inside edges of two adjacent rectangles that together form a larger rectangle, are filtered out by checking the final bitmap for actual layer boundaries at the locations of possibly false edges.

The invention has been described with reference to different embodiments for lens characterization and the identification of residual aberration induced feature changes in masks for integrated circuit fabrication. While the invention has been described with reference to specific applications and embodiments, the description is illustrative of the invention and is not to be construed as limiting the invention. Various modifications and applications may occur to those skilled in the art without departing from the true spirit and scope of the invention as defined by the appealed claims.

The following papers are submitted herewith in the attached Appendix and are incorporated by reference for all purposes:

"Modeling defect-feature interactions in the presence of aberrations," Neureuther, Hotta, Adam.

"Measuring Optical Image Aberrations with Pattern and Probe Based Targets," Robins, Adam, Neureuther, J. Vac. Sci. Technol. B 20(1) January/February 2002.

"Operational model for pattern and probe based aberration monitors," Robins, Neureuther.

"Aberrations are a big part of OPC for phase-shifting masks," Gennari, Neureuther.

"Pattern Matcher for Locating Areas in Phase-Shift Masks Sensitive to Aberrations," Gennari Research Project, University of California, Berkeley.

"Validation of the aberration pattern-matching OPC strategy," Gennari, Robins, Neureuther.

"Advanced Layout CAD for Residual Processing Issues or No-fault assurance: linking fast process CAD and EDA," Neureuther.

"Simulation of image quality issues at low k1 for 100 nm lithography," Neureuther, Adam, Hotta, Pistor, Robbins, Deng, Proceedings of the SPIE, Yokohama, Japan 25–27 Apr. 2001, SPIE-Int. Soc. Eng. 2001, pp. 33–40.

"No-fault assurance: linking fast process CAD and EDA," Andrew R. Neureuther and Frank Gennari.

What is claimed is:

1. A method of detecting aberrations in a lens comprising the steps of:
    a) providing a mask having an opening probe and a surrounding open geometry pattern wherein the surrounding pattern corresponds to the inverse Fourier transform of an aberration representation,
    b) projecting a beam through the mask and a lens to an image plane of the lens, and
    c) identifying lens aberrations from the combined intensity of the beam passing through the probe and the surrounding pattern in the image plane without the need for Fourier analysis of the projection beam.

2. The method as defined by claim 1 wherein the beam is selected from the group consisting of optical, electromagnetic acoustic, surface wave, and particle.

3. The method as defined by claim 2 wherein the beam projecting through the mask is coherent through the surrounding pattern.

4. The method as defined by claim 1 wherein each surrounding pattern comprises a plurality of rings concentric with a probe.

5. The method as defined by claim 1 wherein the aberrations is selected from the consisting of coma, astigmatism, spherical and trifoil.

6. The method as defined by claim 1 wherein the aberrations include at least one term in a general mathematical representation.

7. The method as defined by claim 1 wherein step c) includes comparing an image intensity in the image plane with known intensity for an aberration.

8. The method as defined by claim 1 wherein the aberrations include at least one of coma, astigmatism, spherical, and trifoil or any term or combination of terms in a general representation.

9. The method as defined by claim 7 wherein a combined intensity pattern of the image includes spillover between the probe and the surrounding pattern which becomes intermixed in passing through the lens.

10. The method as defined by claim 9 wherein the beam comprises a collimated light beam.

11. The method as defined by claim 9 wherein the lens comprises a plurality of lenses in a lens system.

12. The method as defined by claim 9 wherein the surrounding pattern comprises a plurality of rings concentric with the probe.

13. The method as defined by claim 12 wherein the rings are modulated in phase in an azimuthal direction in accordance with the rotational order of a Zernike polynomial.

14. The method as defined by claim 1 wherein the lens comprises a plurality of lenses in a lens system.

15. The method as defined by claim 1 wherein step c) includes measuring the combined image intensity and comparing the measurements to an individual image of the probe and surrounding pattern without aberrations.

16. The method as defined by claim 15 wherein the aberrations include coma, astigmatism, spherical, and trifoil.

17. The method as defined by claim 15 wherein the aberrations include at least one term in a general mathematical representation.

18. The method as defined by claim 15 wherein a combined intensity pattern of the image includes spillover between the probe and the surrounding pattern which became intermixed in passing through the lens, the probe providing an interferometric reference.

19. The method as defined by claim 18 wherein the beam comprises a collimated light beam.

20. The method as defined by claim 18 wherein the lens comprises a plurality of lenses in a lens system.

21. The method as defined by claim 18 wherein the surrounding pattern comprises a plurality of rings concentric with the probe.

22. The method as defined by claim 15 wherein the measurements are obtained indirectly.

23. The method as defined by claim 22 wherein indirect measurements are taken from photoresist which is exposed to the probe and surrounding pattern.

24. The method as defined by claim 15 wherein the measurements are obtained directly from image intensity.

25. The method as defined by claim 15 wherein the surrounding pattern comprises a plurality of rings concentric with the probe.

* * * * *